(12) United States Patent
Tiebout et al.

(10) Patent No.: US 7,977,709 B2
(45) Date of Patent: Jul. 12, 2011

(54) MOS TRANSISTOR AND SEMICONDUCTOR DEVICE

(75) Inventors: Marc Tiebout, Finkenstein (AT); Daniel Kehrer, Munich (DE); Domagoj Siprak, Munich (DE); Pierre Mayr, Essen (DE); Johannes Kunze, Hattingen (DE); Christopher Weyers, Bochum (DE)

(73) Assignee: Infineon Technologies AG, Neubiberg (DE)

( * ) Notice: Subject to any disclaimer, the term of this patent is extended or adjusted under 35 U.S.C. 154(b) by 174 days.

(21) Appl. No.: 11/968,552

(22) Filed: Jan. 2, 2008

(65) Prior Publication Data
US 2009/0166681 A1   Jul. 2, 2009

(51) Int. Cl.
*H01L 27/18* (2006.01)

(52) U.S. Cl. . 257/206; 257/776; 257/758; 257/E27.108; 257/E21.632

(58) Field of Classification Search .................. 257/776, 257/758, 752, 206, E27.108, E21.632
See application file for complete search history.

(56) References Cited

U.S. PATENT DOCUMENTS
2004/0140569 A1* 7/2004 Meguro et al. ............... 257/776

OTHER PUBLICATIONS

Knoblinger, G., et al., "A New Model for Thermal Channel Noise of Deep Submicron MOSFETs and its Application in RF-CMOS Design," 2000 Symposium on VLSI Circuits, Digest of Technical Papers 2000, Jun. 15-17, 2000, pp. 150-153, IEEE, Los Alamitos, CA.

Nicolson, S. T., et al., "Methodology for Simultaneous Noise and Impedance Matching in W-Band LNAs," IEEE 2006 Compound Semiconductor Integrated Circuit Symposium, CSIC 2006, Nov. 2006, pp. 279-282, IEEE, Los Alamitos, CA.

Khanpour, M., et al., "A High-Gain, Low-Noise, +6dBm PA in 90nm CMOS for 60-GHz Radio," IEEE 2007 Compound Semiconductor Integrated Circuit Symposium, CSIC 2007, Oct. 14-17, 2007, pp. 1-4, IEEE, Los Alamitos, CA.

Weyers, C., et al. "Improved RF-Performance of Sub-Micron CMOS Transistors by Asymmetrically Fingered Device Layout," Radio Frequency Integrated Circuits Symposium, 2008, pp. 563-566, IEEE.

* cited by examiner

*Primary Examiner* — Jerome Jackson, Jr.
*Assistant Examiner* — Dale Page
(74) *Attorney, Agent, or Firm* — Slater & Matsil, L.L.P.

(57) ABSTRACT

According to one embodiment of the present invention, a MOS transistor includes a semiconductor layer including a source region, a drain region, and a channel region disposed between the source region and the drain region. A gate structure is arranged above the channel regions. A source wiring structure is arranged above the source region and is connected to the source region. A drain wiring structure is arranged above the drain region and is connected to the drain region. The width of the source wiring structure is larger than the width of the drain wiring structure, and the height of the source wiring structure is smaller than the height of the drain wiring structure, or vice versa.

10 Claims, 20 Drawing Sheets

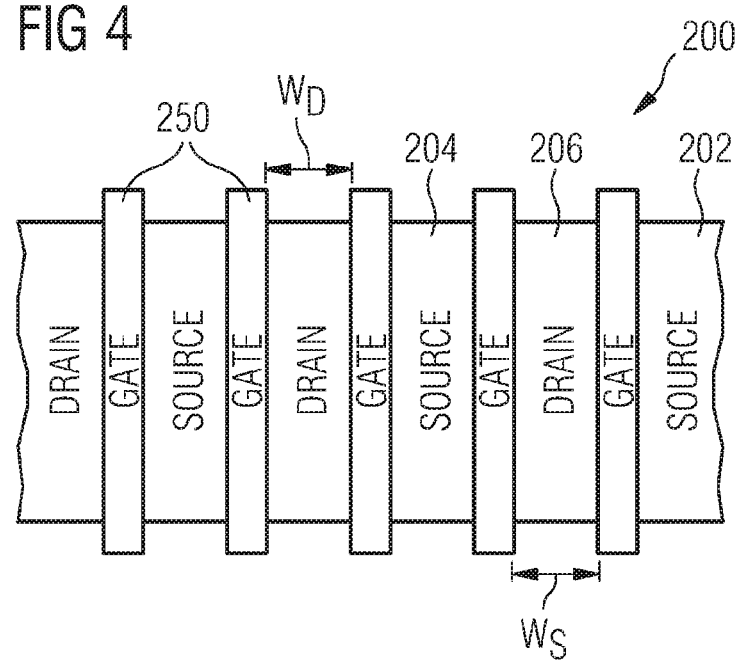
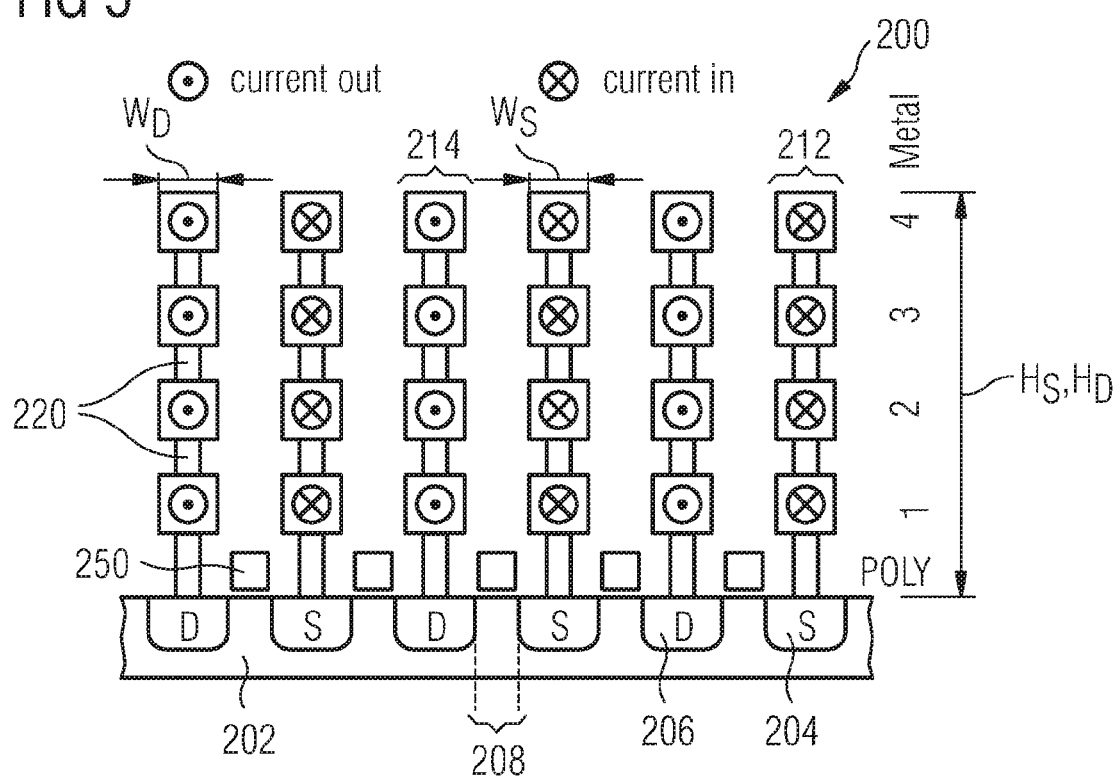

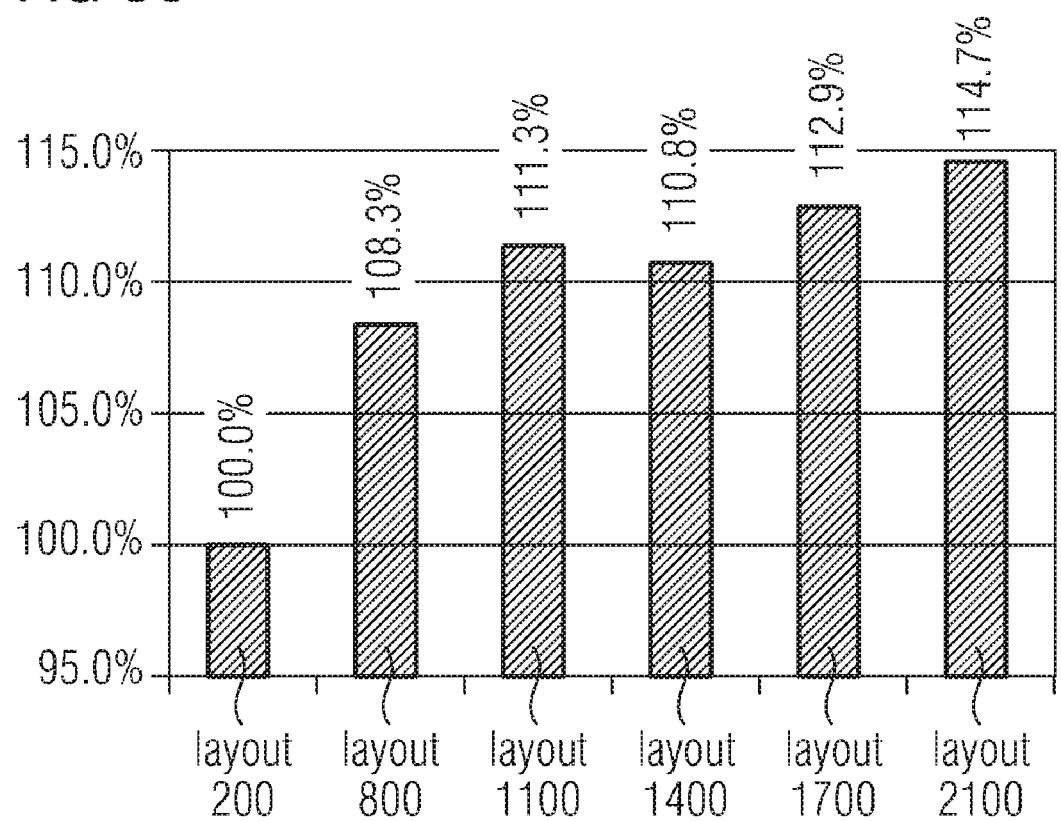

MOS TRANSISTOR AND SEMICONDUCTOR DEVICE

BACKGROUND

Semiconductor devices are used in many technical fields. Examples of semiconductor devices are active analogue devices like MOS transistors. In order to broaden the application range of active analogue devices, it is necessary to improve the characteristics of the semiconductor devices.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 4 shows a schematic top view of the semiconductor device shown in FIG. 2;

FIG. 5 shows a schematic cross-sectional view of the semiconductor device shown in FIG. 2;

FIG. 30 shows a diagram of oscillation frequencies obtained using MOS transistors/semiconductor devices according to embodiments of the present invention.

DETAILED DESCRIPTION OF ILLUSTRATIVE EMBODIMENTS

Figure 1:
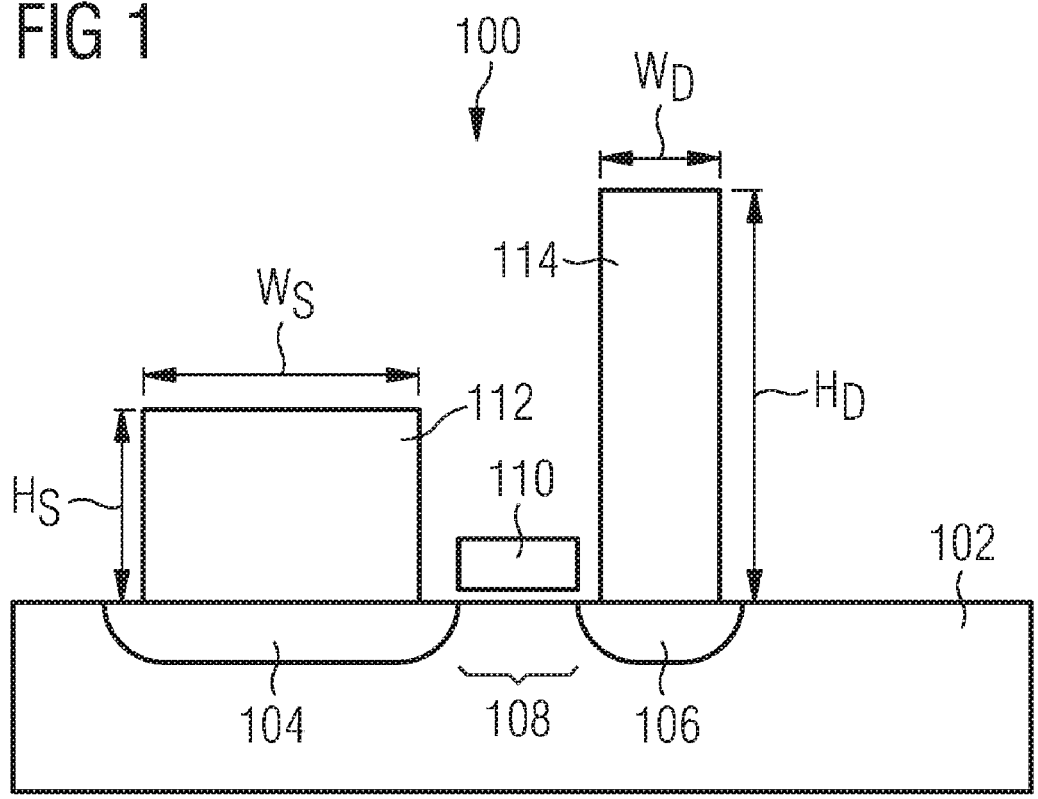
FIG. 1 shows a schematic cross-sectional view of a MOS transistor according to one embodiment of the present invention.
Figure 2:
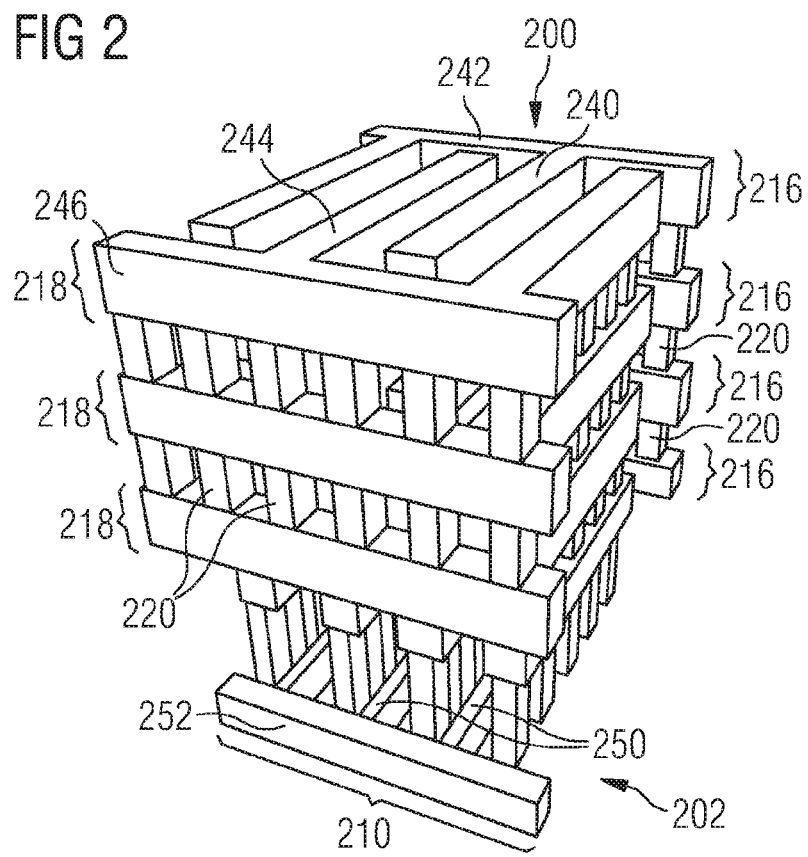
FIG. 2 shows a schematic perspective view of a semiconductor device.
Figure 3:
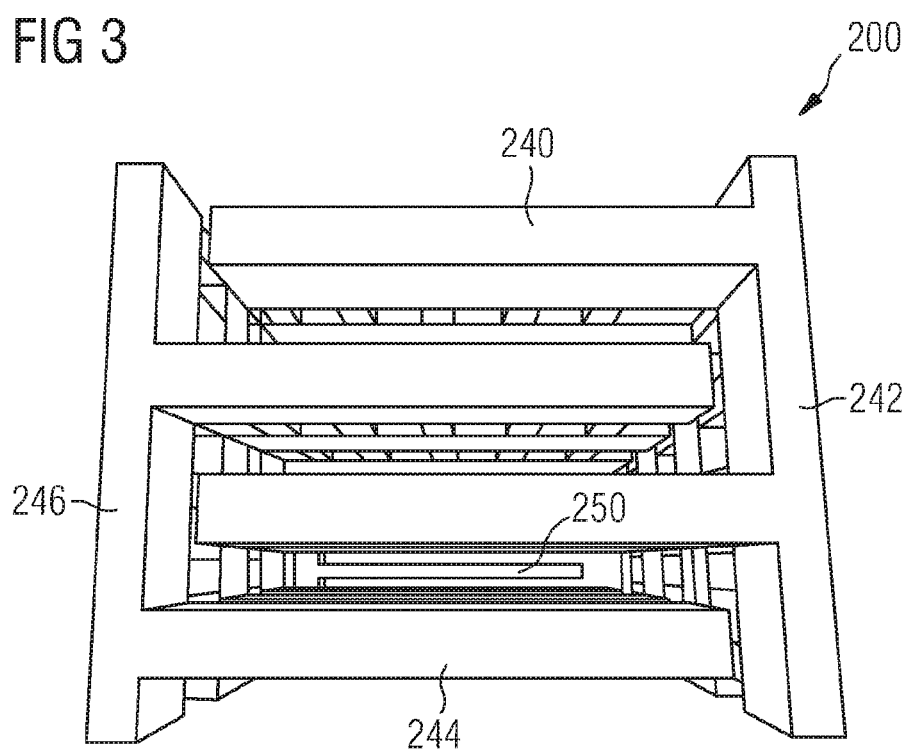
FIG. 3 shows a schematic top view of the semiconductor device shown in FIG. 2.

FIG. 1 shows a MOS transistor 100 which includes: a semiconductor layer 102 including a source region 104, a drain region 106, and a channel region 108 disposed between the source region 104 and the drain region 106; a gate structure 110 being arranged above the channel region 108; a source wiring structure 112 being arranged above the source region 104 and being electrically connected to the source region 104; and a drain wiring structure 114 being arranged above the drain region 106 and being electrically connected to the drain region 106. The width $W_s$ of the source wiring structure 112 is larger than the width $W_d$ of the drain wiring structure 114, and the height $H_s$ of the source wiring structure 112 is smaller than the height $H_d$ of the drain wiring structure 114. It is to be understood that the source wiring structure 112 may also have a height being larger than that of the drain wiring structure 114, and may also have a width being smaller than the width of the drain wiring structure 114.

According to one embodiment of the present invention, the widths $W_s$, $W_d$ and the heights $H_s$, $H_d$ of the source wiring structure 112 and the drain wiring structure 114 are chosen such that parasitic capacitances between the source wiring structure 112 and the drain wiring structure 114 are minimized.

To be more general, according to one embodiment of the present invention, the source/drain wiring structure (the source wiring structure 112 and the drain wiring structure 114 as a whole) has an asymmetric design. The asymmetric design is chosen such that parasitic capacitances between parts of the MOS transistor 100 are reduced (e.g., by enlarging distances between parts of the MOS transistor 100) while keeping the maximum current routable through the source wiring structure 112 and the drain wiring structure 114 constant. Alternatively, the asymmetric design is chosen such that the maximum current routable through the source wiring structure 112 and the drain wiring structure 114 is increased (e.g., by increasing the number or thickness of conductive lines of the source wiring structure 112 and the drain wiring structure 114) while at the same time the parasitic capacitances between parts of the MOS transistor 100 are kept constant. Still alternatively, the asymmetric design is chosen such that the maximum current routable through the source wiring structure 112 and the drain wiring structure 114 is increased while at the same time the parasitic capacitances between parts of the MOS transistor 100 are reduced.

According to one embodiment of the present invention, a ratio: width $W_s$ of the source wiring structure 112/width $W_d$ of the drain wiring structure 114 ranges between (larger than) 1 and 8, and a ratio: height $H_s$ of the source wiring structure 112/height $H_d$ of the drain wiring structure 114 ranges between 1 and 8. Alternatively, a ratio: width $W_d$ of the drain wiring structure 114/width $W_d$ of the source wiring structure 112 ranges between 1 and 8, and a ratio: height $H_d$ of the drain wiring structure 114/height $H_s$ of the source wiring structure 112 ranges between 1 and 8.

According to one embodiment of the present invention, a ratio: width $W_s$ of the source wiring structure 112/width $W_d$ of the drain wiring structure 114 ranges between 1 and 4, and a ratio: height $H_s$ of the source wiring structure 112/height $H_d$ of the drain wiring structure 114 ranges between 1 and 4. Alternatively, a ratio: width $W_d$ of the drain wiring structure 114/width $W_s$ of the source wiring structure 112 ranges between 1 and 4, and a ratio: height $H_d$ of the drain wiring structure 114/height $H_s$ of the source wiring structure 112 ranges between 1 and 4.

According to one embodiment of the present invention, a ratio: width $W_s$ of the source wiring structure 112/width $W_d$ of the drain wiring structure 114 ranges between 2 and 4, and a ratio: height $H_s$ of the source wiring structure 112/height $H_d$ of the drain wiring structure 114 ranges between 2 and 4. Alternatively, a ratio: width $W_d$ of the drain wiring structure 114/width $W_s$ of the source wiring structure 112 ranges between 2 and 4, and a ratio: height $H_d$ of the drain wiring structure 114/height $H_s$ of the source wiring structure 112 ranges between 2 and 4.

One effect of the ratios mentioned above is that parasitic capacitances between the source wiring structure 112 and the drain wiring structure 114 and between the source wiring structure 112 and the gate structure 110 can be reduced very effectively. The design shown in FIG. 1 can be extended to semiconductor devices having a plurality of MOS transistors connected in parallel (power semiconductor devices).

FIGS. 2 to 5 show a semiconductor device 200 including a plurality of MOS transistors connected in parallel, each MOS transistor including: a semiconductor layer 202 including a source region 204, a drain region 206 and a channel region 208 disposed between the source region 204 and the drain region 206; a gate structure 210 being arranged above the channel region 208; a source wiring structure 212 being arranged above the source region 204 and being electrically connected to the source region 204; and a drain wiring structure 214 being arranged above the drain region 206 and being electrically connected to the drain region 206.

The width $W_s$ of the source wiring structure 212 is the same as the width $W_d$ of the drain wiring structure 206. The height $H_s$ of the source wiring structure 212 is the same as the height $H_d$ of the drain wiring structure 214. The semiconductor layer 202 is a common semiconductor layer including the source regions 204 and the drain regions 206 of all MOS transistors. Here, the source regions 204 and the drain regions 206 have the same dimensions.

Each source wiring structure 212 includes a plurality of conductive lines 240 stacked above each other. The conductive lines 240 are vertically connected with each other by electrical connections 220. The conductive lines 240 of different source wiring structures 212 are laterally connected with each other by conductive lines 242. In this way, the source wiring structures 212 of all MOS transistors are electrically connected with each other. Each drain wiring structure 214 includes a plurality of conductive lines 244 stacked above each other. The conductive lines 244 are vertically connected with each other by electrical connections 220. The conductive lines 244 of different drain wiring structures 214 are laterally connected with each other by conductive lines 246. In this way, the drain wiring structures 214 of all MOS transistors are electrically connected with each other.

In other words, the source wiring structures 212 are split into a plurality of source wiring layers 216 stacked above each other, and the drain wiring structures 214 are split into a plurality of drain wiring layers 218 stacked above each other. The source wiring layers 216 and the drain wiring layers 218 are electrically connected with each other by the electrical connections 220. The conductive elements (conductive lines 240 and 242) of each source wiring layer 216 together form a finger like conductive element. In the same way, the conductive elements (conductive lines 244 and 246) of each drain wiring layer 216 together form a finger like conductive element. The finger like conductive element of a source wiring layer 216 surrounds the finger like conductive element of the corresponding drain wiring layer 218, and vice versa. The gate structure 210 also has a finger like form including conductive lines 250 which are arranged parallel to the conductive lines 240 and 244, and which are laterally connected with each other by a conductive line 252.

The semiconductor device 200 shown in FIGS. 2 to 5 has a gate structure 210, the conductive lines 250 of which are spaced apart from each other in an equidistant manner. Also, the conductive lines 240 and 244 are spaced apart from each other in an equidistant manner.

Figure 6:
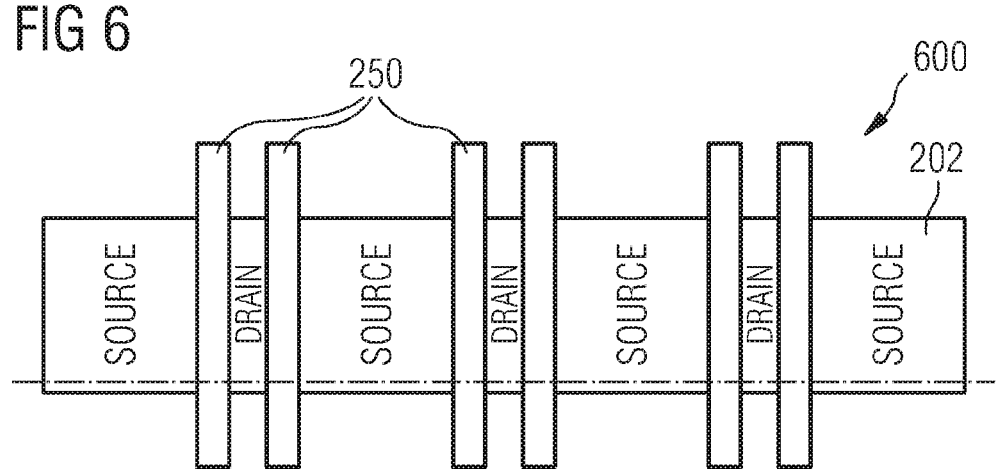
FIG. 6 shows a schematic top view of a semiconductor device according to one embodiment of the present invention.
Figure 7:
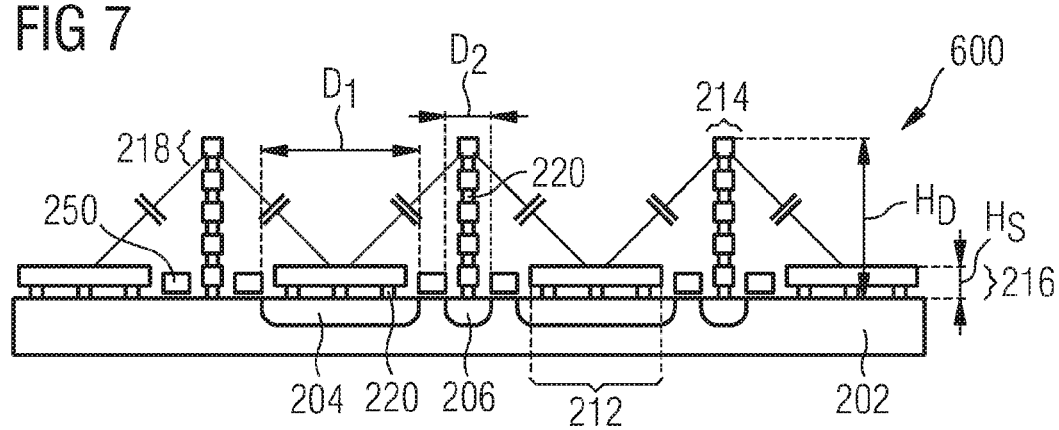
FIG. 7 shows a schematic cross-sectional view of the semiconductor device shown in FIG. 6.

In contrast thereto, FIGS. 6 and 7 show a semiconductor device 600 in which the conductive lines 250 of the gate structure 210 are spaced apart from each other in a non-equidistant manner. That is, a first distance $D_1$ between two neighboring conductive lines 250 sandwiching a source wiring structure 212 is larger than a second distance $D_2$ between two neighboring conductive lines 250 sandwiching a drain wiring structure 214. This is due to the fact that the source wiring structures 212 have a width being larger than that of the drain wiring structures 214. Since the currents which have to be carried through the source wiring structures 212 are the same as the currents which have to be carried through the drain wiring structures 214, the height $H_s$ of the source wiring structures 212 can be smaller than the height $H_d$ of the drain wiring structures 214 (since the width of the source wiring structure 212 is larger than the width of the drain wiring structure 214), as shown in FIGS. 6 and 7. One effect of the semiconductor device 600 is that parasitic capacitances between the source wiring structures 212 and the drain wiring structures 214 are minimized. Different source wiring structures 212 can be laterally connected with each other, as shown in conjunction with FIGS. 2 to 5. The same may also apply for the drain wiring structures 214.

Figure 8:
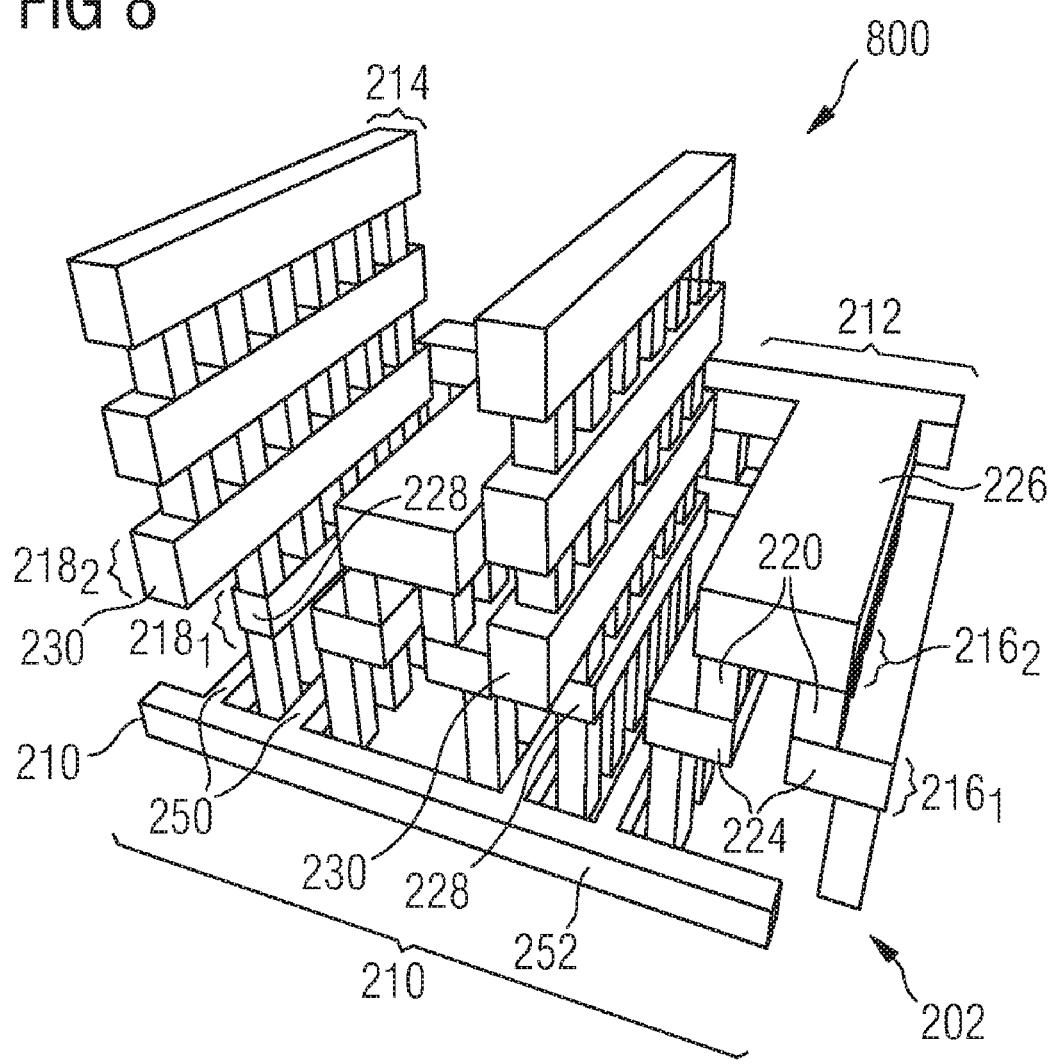
FIG. 8 shows a schematic perspective view of a semiconductor device according to one embodiment of the present invention.

FIG. 8 shows a semiconductor device 800 being similar to the semiconductor device 600 shown in FIGS. 6 and 7. However, the source wiring structures 212 shown in FIG. 7 (which are single continuous conductive plates, i.e., arranged within only one single source wiring layer 216) have been respectively split up into two source wiring layers 216 which are stacked above each other. The first (lowest) source wiring layer $216_1$ of a source wiring structure 212 includes two conductive lines 224 arranged parallel with respect to each other. The second source wiring layer $216_2$ of a source wiring structure 212 includes one conductive line 226 which is electrically connected to the two conductive lines 224 of the first source wiring layers $216_1$ by electrical connections 220. The conductive line 226 of the second source wiring layer $216_2$ is thicker than the conductive lines 224 of the first source wiring layer $216_1$. Further, in FIGS. 9 and 10, a distance $D_3$ between the conductive lines 224 and neighboring conductive lines 228 of a first drain wiring layer $218_1$ is smaller than a distance $D_4$ between the conductive elements 226 and conductive elements 230 of a second drain wiring layer $218_2$. One effect of using different lateral distances $D_3$, $D_4$ is that the parasitic capacitances between the source wiring structures 212 and the drain wiring structures 214 can be further reduced.

Figure 11:
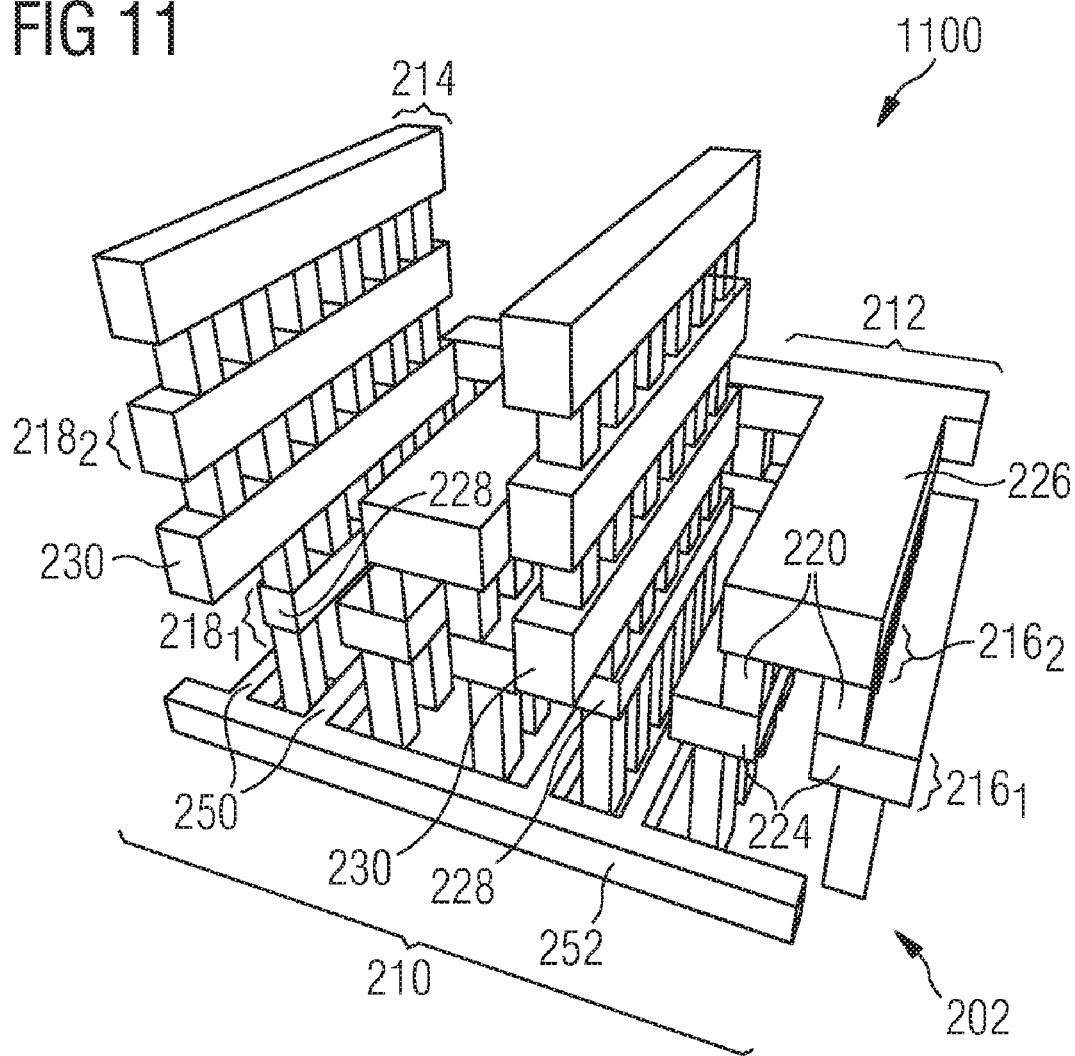
FIG. 11 shows a schematic perspective view of a semiconductor device according to one embodiment of the present invention.
Figure 12:
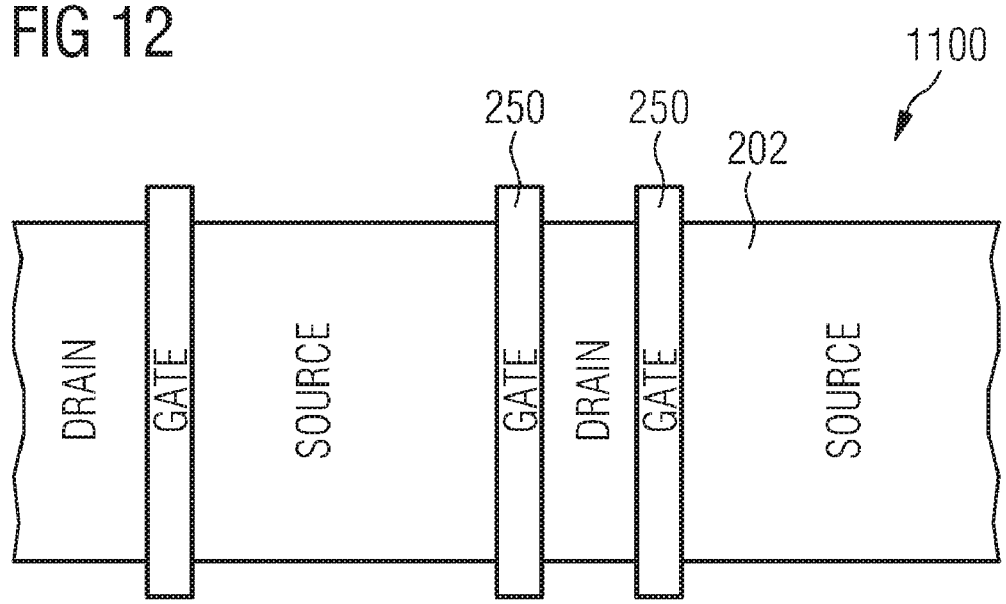
FIG. 12 shows a schematic top view of the semiconductor device shown in FIG. 11.
Figure 13:
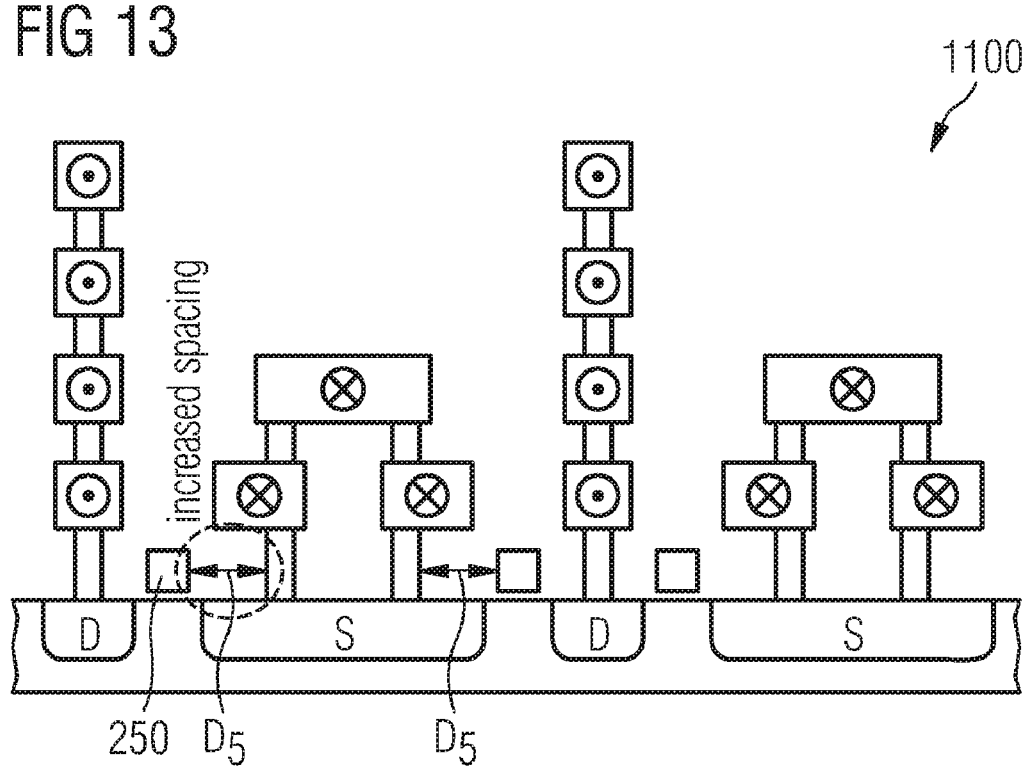
FIG. 13 shows a schematic cross-sectional view of the semiconductor device shown in FIG. 11.

FIGS. 11 to 13 show a semiconductor device 1100 having an architecture being similar to that of the semiconductor device 800 shown in FIG. 8. However, a distance $D_5$ between the conductive lines 250 of the gate structure 210 and neighboring electrical connections 220 connecting the source regions 104 to the conductive lines 224 of the first source wiring layer $216_1$ is enlarged. In this way, parasitic capacitances between the source wiring structures 212 and the gate structures 210 can be further reduced.

Figure 14:
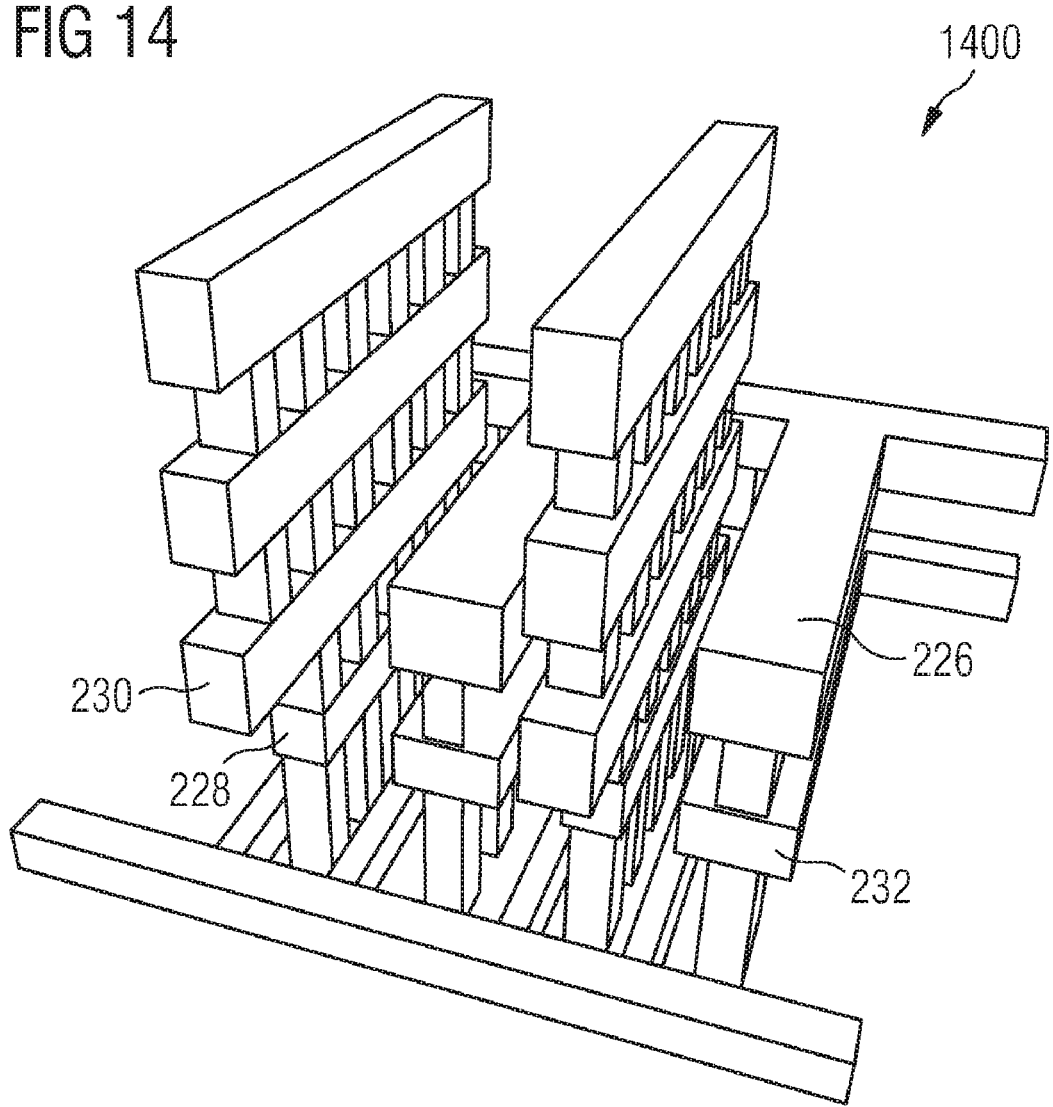
FIG. 14 shows a schematic perspective view of a semiconductor device according to one embodiment of the present invention.
Figure 15:
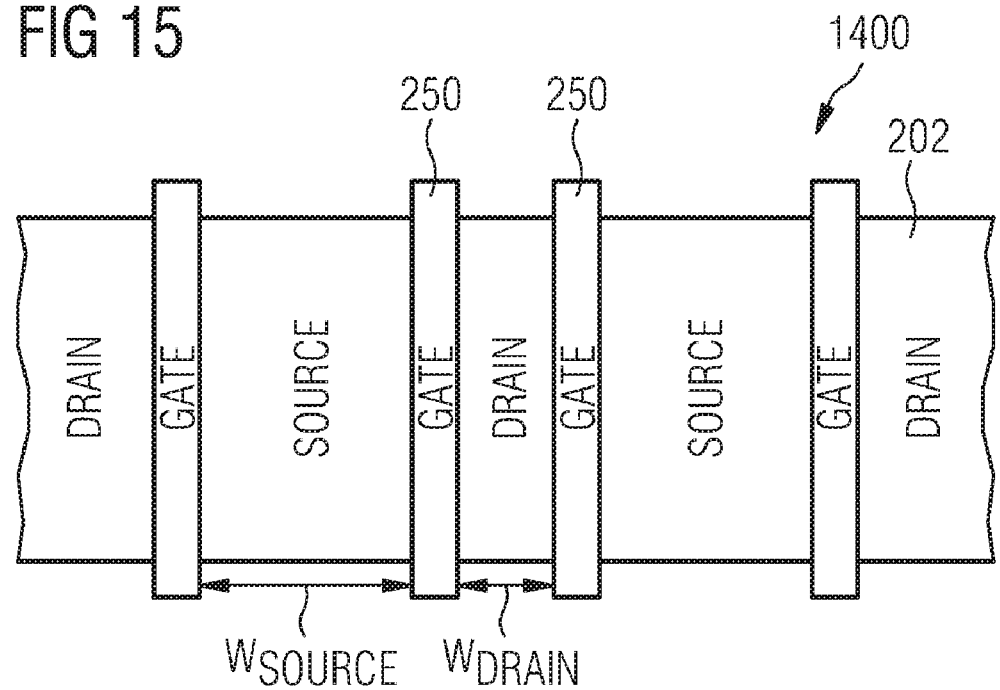
FIG. 15 shows a schematic top view of the semiconductor device shown in FIG. 14.
Figure 16:
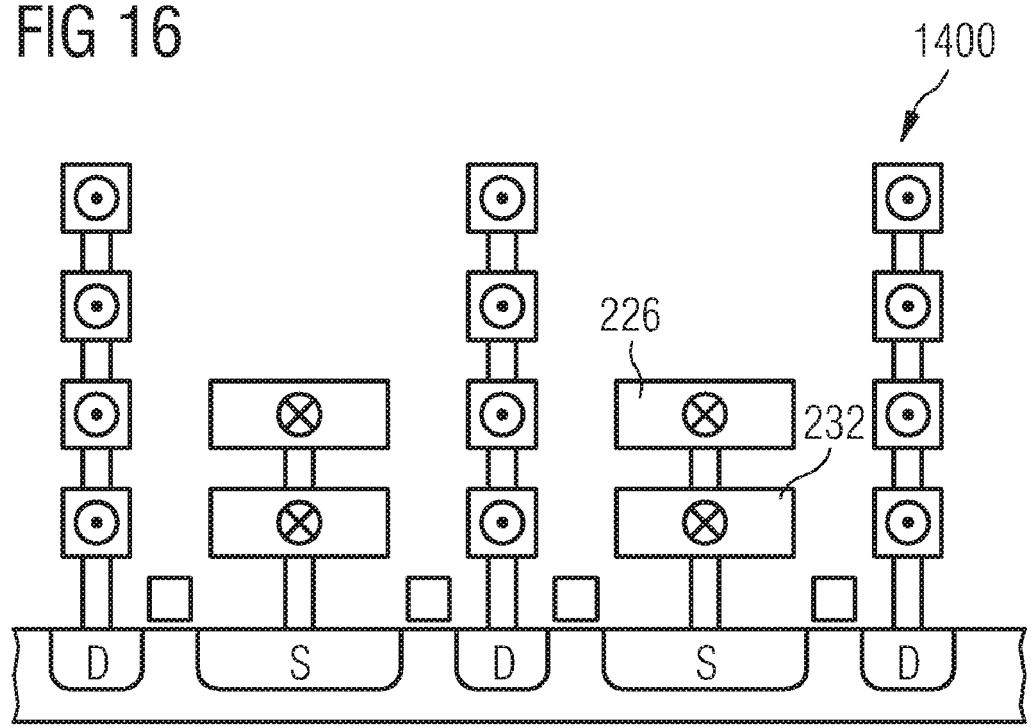
FIG. 16 shows a schematic cross-sectional view of the semiconductor device shown in FIG. 14.

FIGS. 14 to 16 show a semiconductor device 1400, the architecture of which is similar to that of the semiconductor device 800 shown in FIG. 8. However, the two conductive lines 224 of the first source wiring layer $216_1$ have been condensed into one single conductive line 232. In this way, each of the conductive lines 232, 226 has a larger thickness than corresponding conductive lines 228, 230 of the drain wiring structures 214. Compared to the semiconductor device 1100, the semiconductor device 1400 is more compact.

Figure 17:
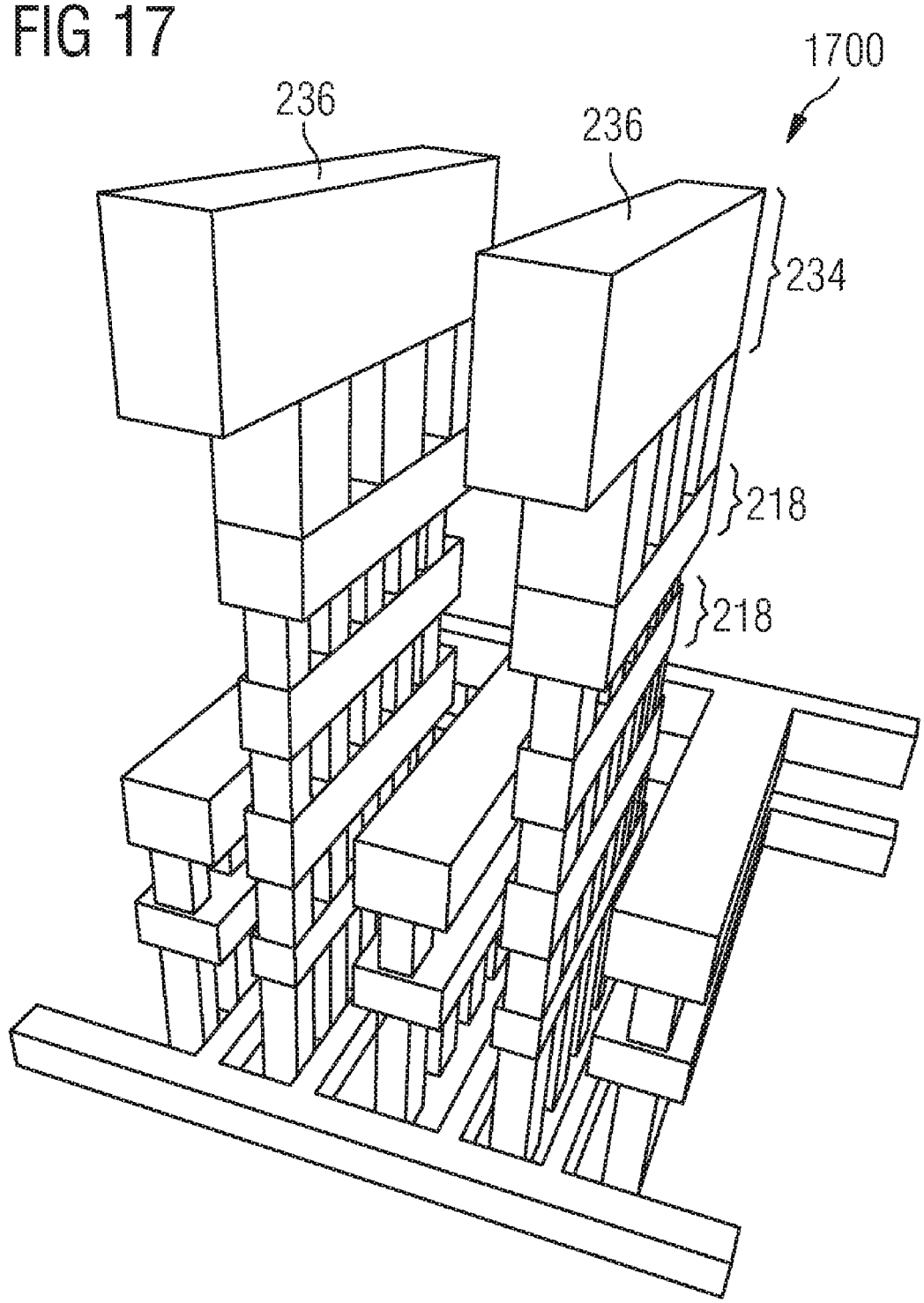
FIG. 17 shows a schematic perspective view of a semiconductor device according to one embodiment of the present invention.
Figure 18:
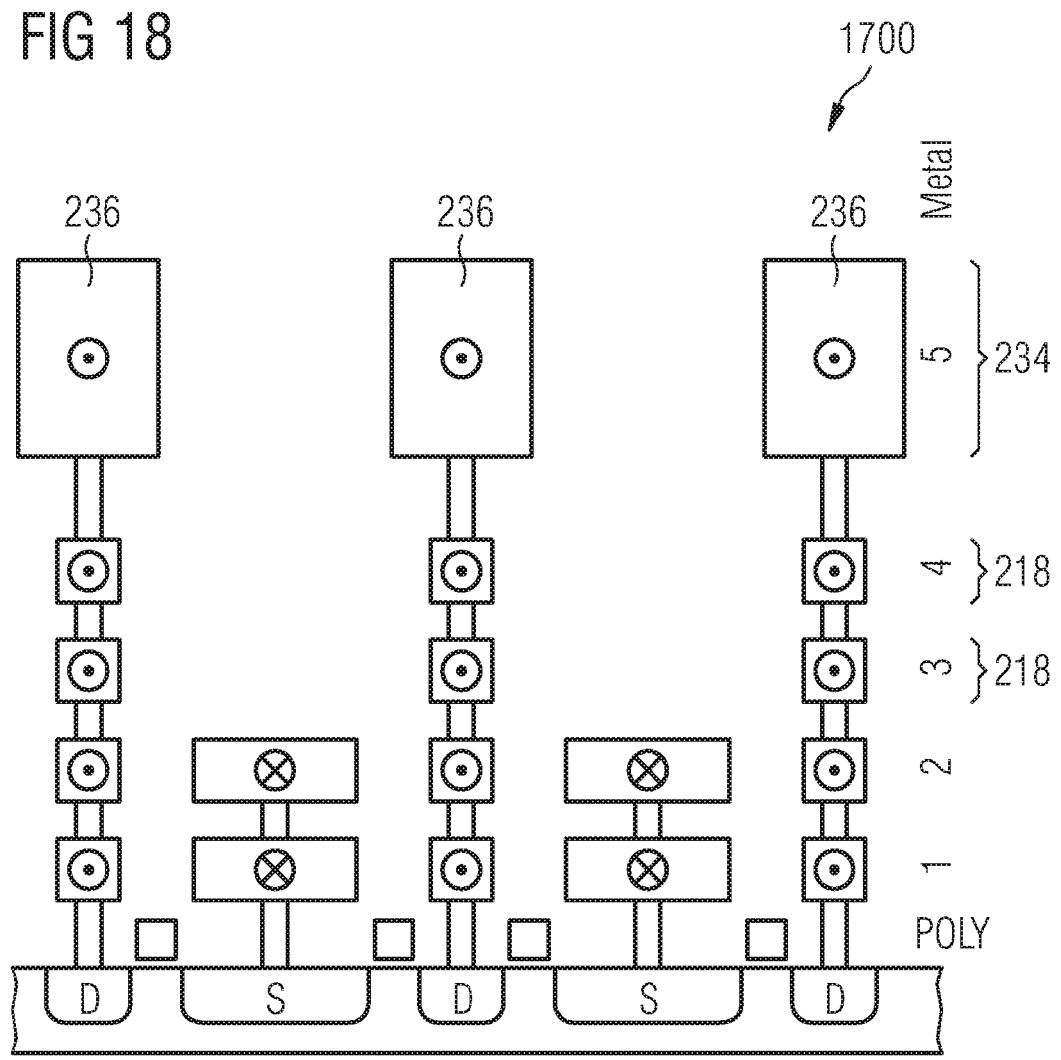
FIG. 18 shows a schematic cross-sectional view of the semiconductor device shown in FIG. 17.

FIGS. 17 and 18 show a semiconductor device 1700 having an architecture similar to the architecture of the semiconductor device 1400 shown in FIG. 14. However, the semiconductor device 1700 additionally shows a further drain wiring layer 234, the conductive lines 236 of which having a larger thickness than the conductive lines 230 of lower drain wiring layers 218. One effect of the semiconductor device 1700 is that higher currents can be transported through the drain wiring structures 214.

Figure 19:
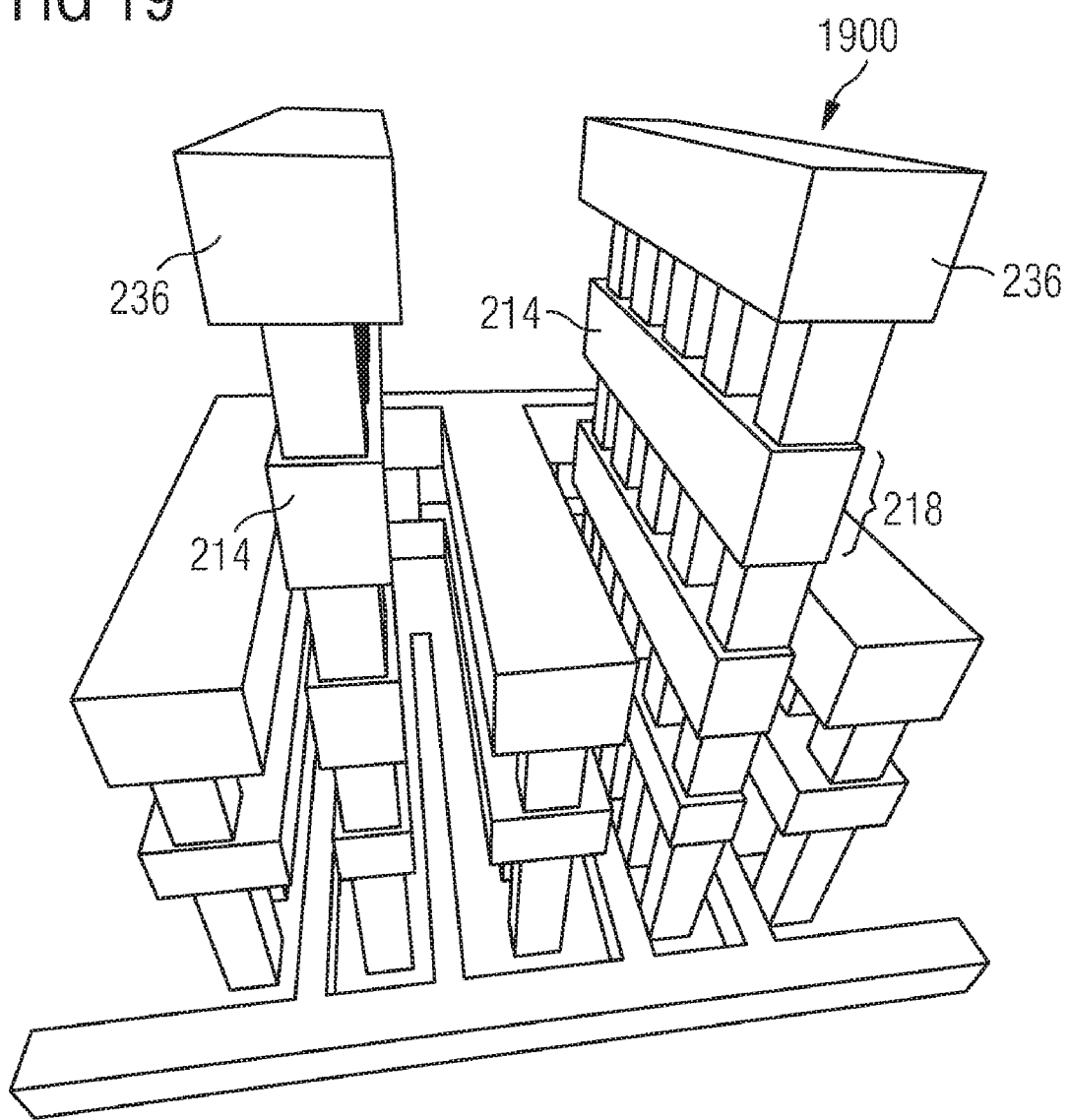
FIG. 19 shows a schematic perspective view of a semiconductor device according to one embodiment of the present invention.

FIG. 19 shows a semiconductor device 1900 having fewer drain wiring layers 218, compared to the semiconductor device 1700 of FIG. 17. Similar to the semiconductor device 1700, conductive lines 236 of the uppermost drain wiring layers 234 have an enlarged thickness, compared to the conductive lines of lower drain wiring layers 218.

Figure 20:
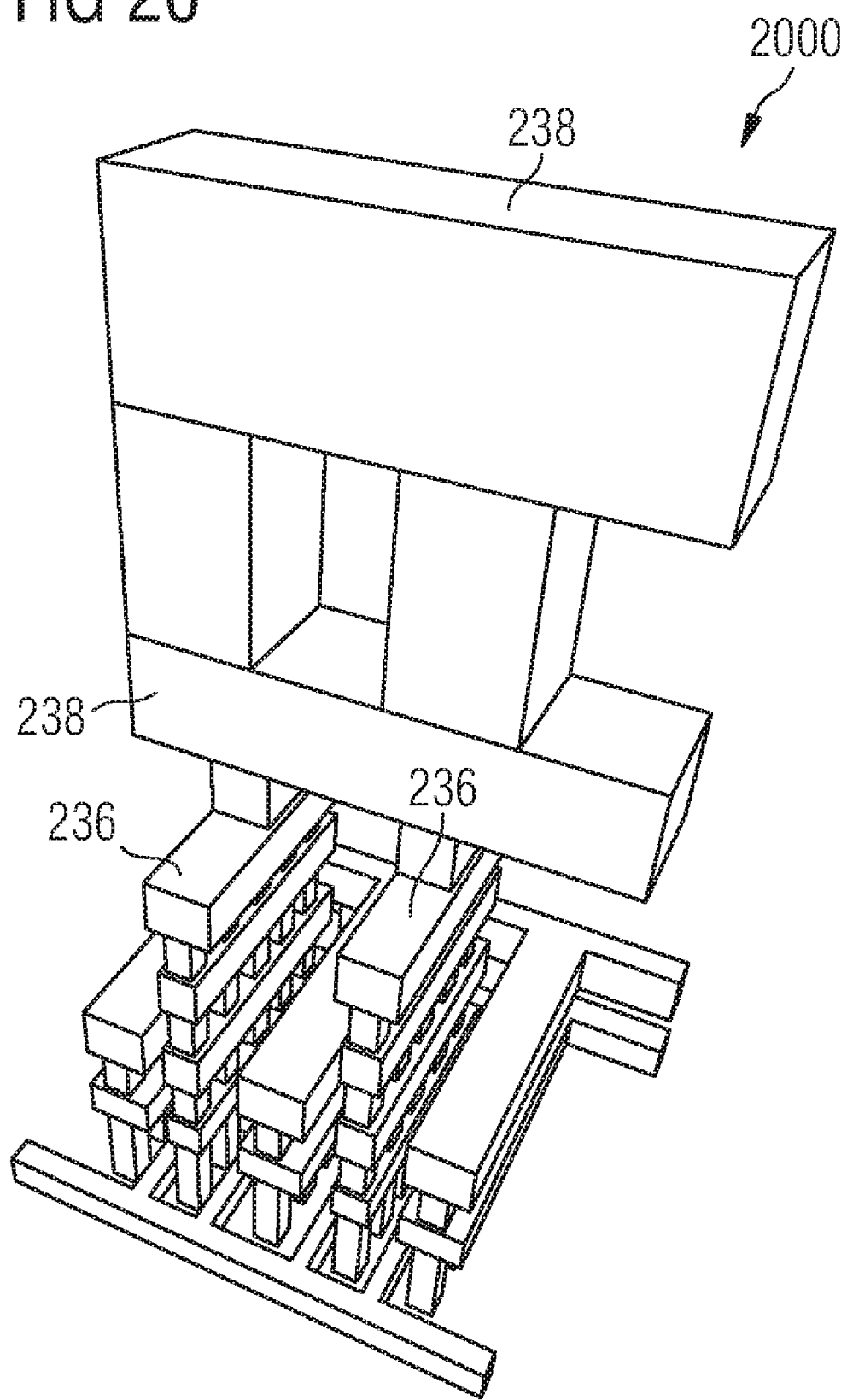
FIG. 20 shows a schematic perspective view of a semiconductor device according to one embodiment of the present invention.

FIG. 20 shows a semiconductor device 2000 which, compared to the semiconductor device 1900 shown in FIG. 19, includes further conductive lines 238 arranged above the conductive lines 236 and electrically connected to the conductive lines 236 by electrical connections 220. The conductive lines 238 are arranged perpendicular to the conductive lines 236.

Figure 21:
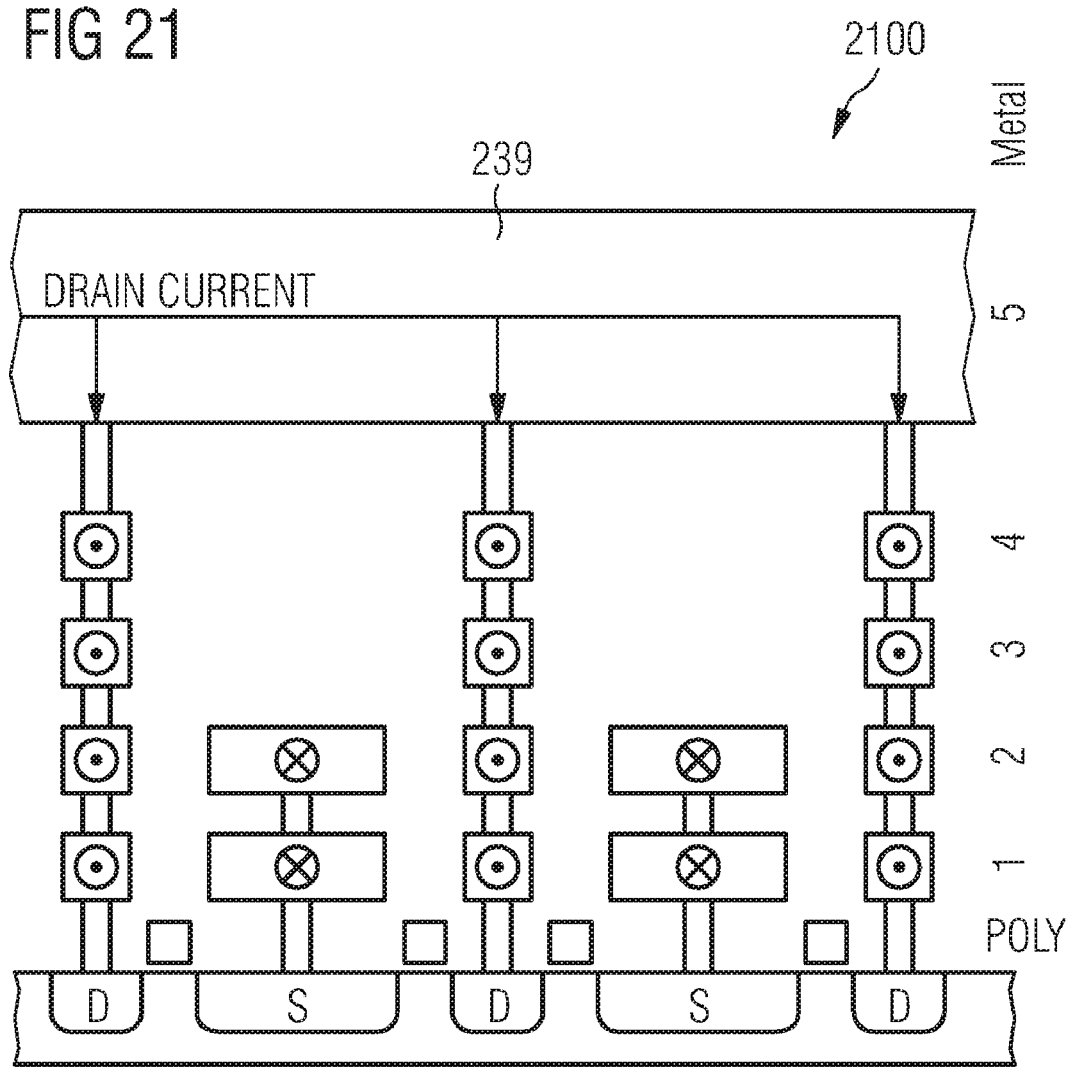
FIG. 21 shows a schematic cross-sectional view of a semiconductor device according to one embodiment of the present invention.

FIG. 21 shows a semiconductor device 2100 in which the conductive lines 238 of the semiconductor device 2000 of FIG. 20 have been replaced by a single continuous conductive plate 239.

Figure 9:
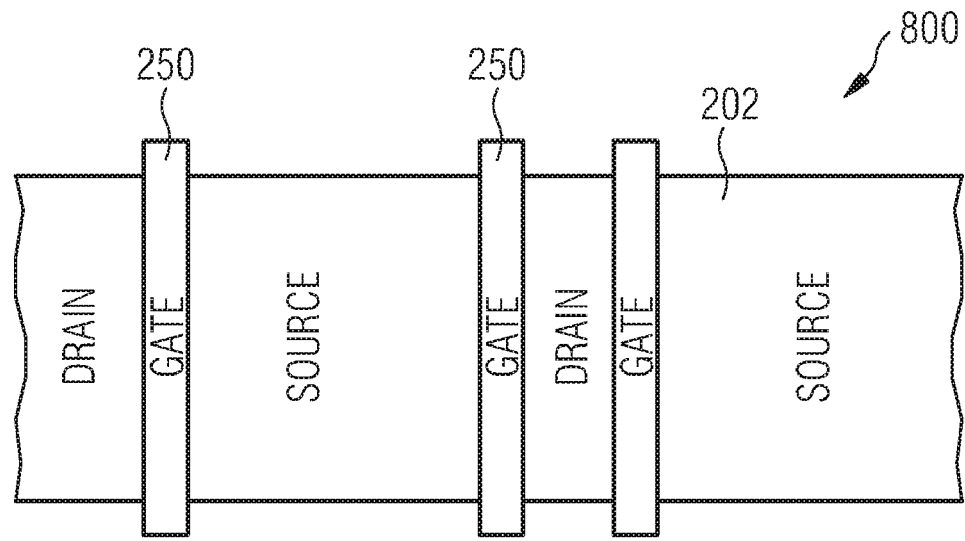
FIG. 9 shows a schematic top view of the semiconductor device shown in FIG. 8.
Figure 10:
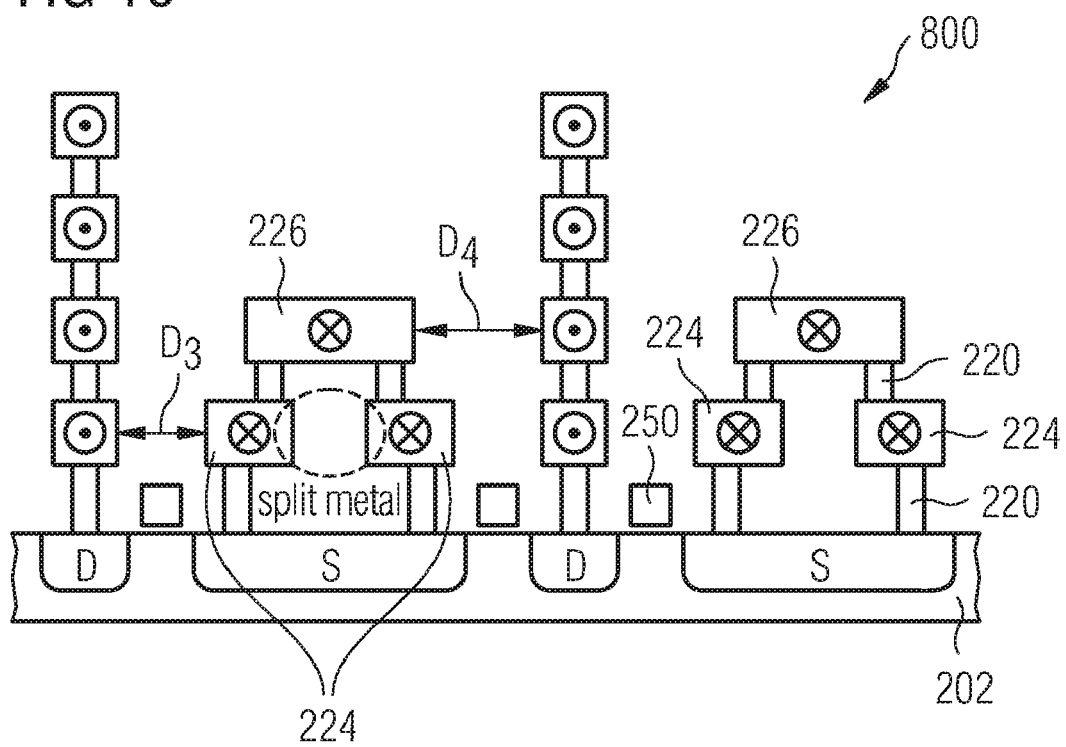
FIG. 10 shows a schematic cross-sectional view of the semiconductor device shown in FIG. 8.
Figure 22:
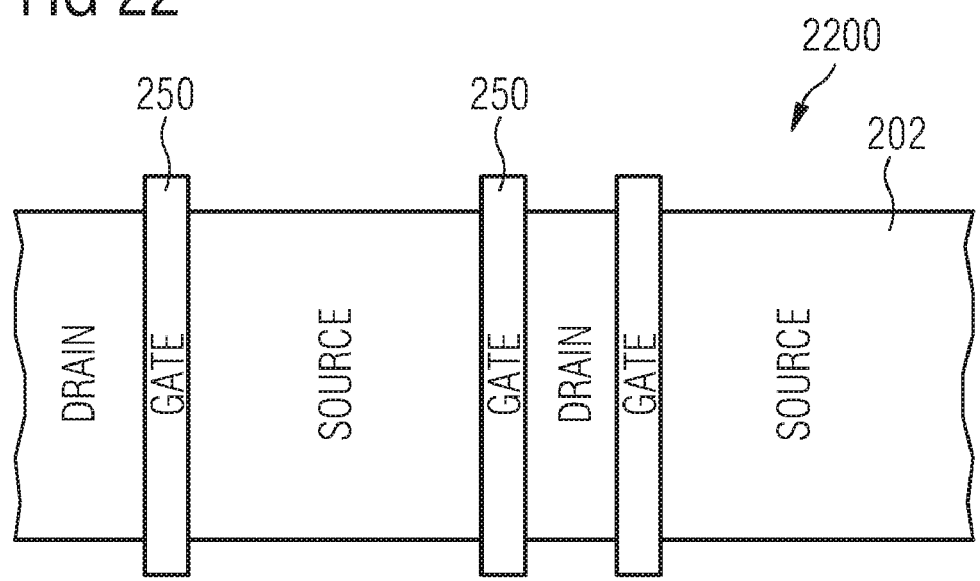
FIG. 22 shows a schematic top view of a semiconductor device according to one embodiment of the present invention.
Figure 23:
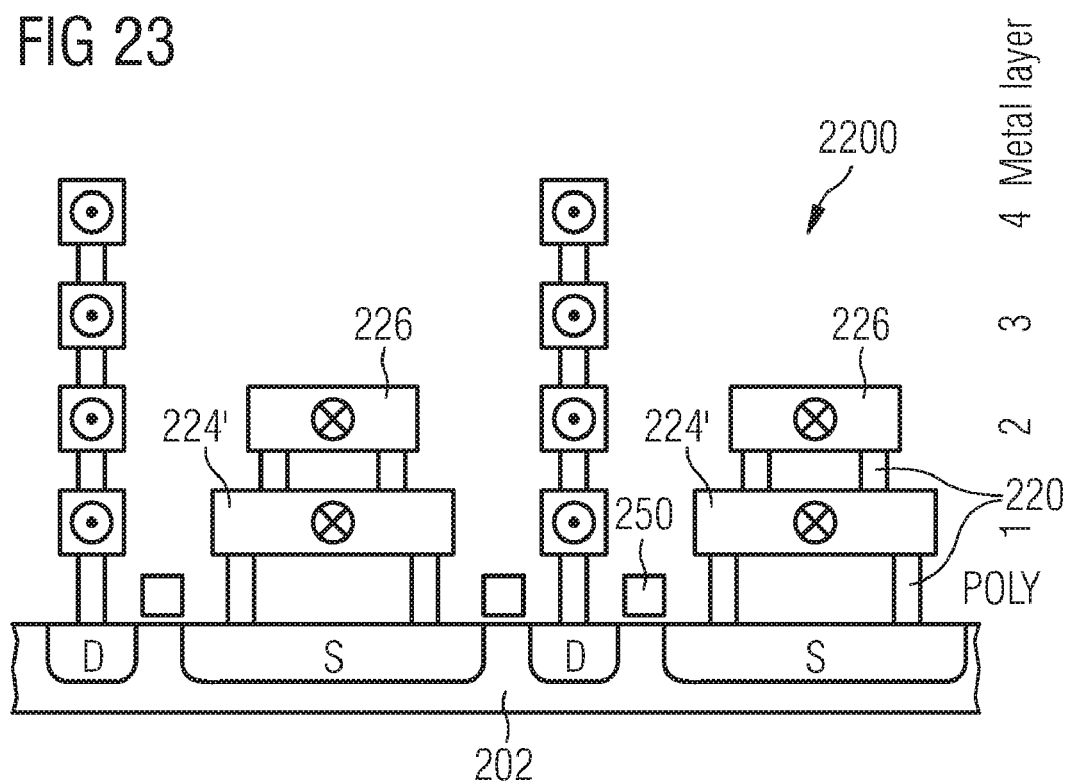
FIG. 23 shows a schematic cross-sectional view of the semiconductor device shown in FIG. 22.

FIGS. 22 and 23 show a semiconductor device 2200 having an architecture similar to the architecture of the semiconductor device 800 shown in FIGS. 8 to 10. However, the two separated conductive lines 224 have been condensed into one single conductive line 224'.

Figure 24:
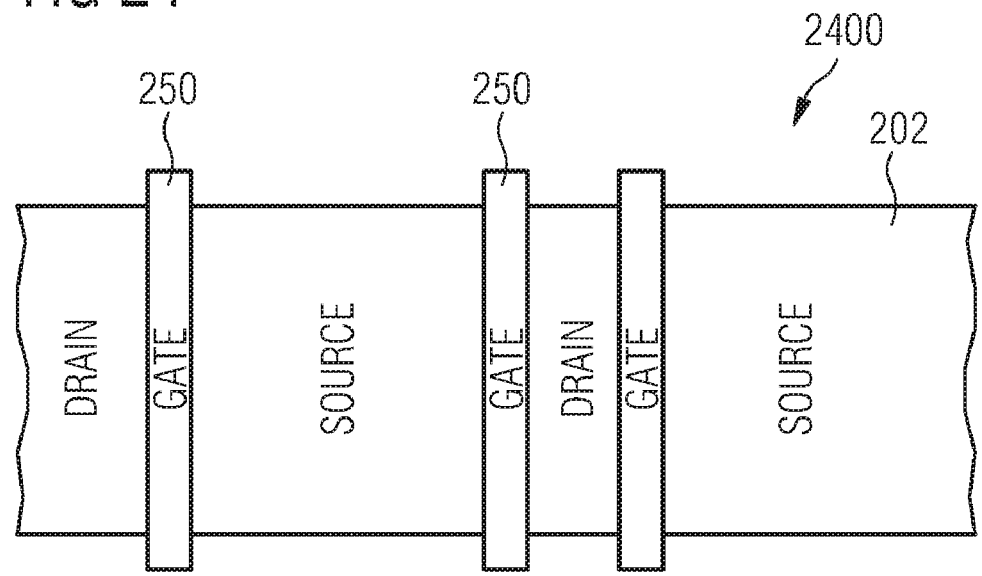
FIG. 24 shows a schematic top view of a semiconductor device according to one embodiment of the present invention.
Figure 25:
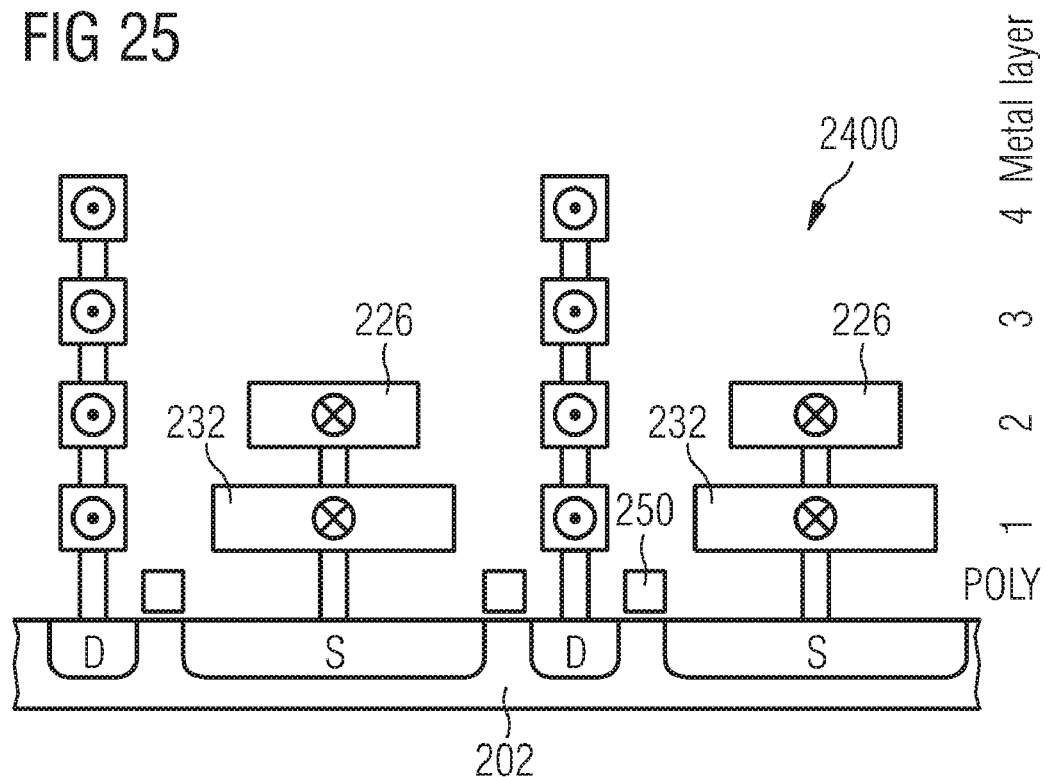
FIG. 25 shows a schematic cross-sectional view of the semiconductor device shown in FIG. 24.

FIGS. 24 and 25 show a semiconductor device 2400 having an architecture similar to the architecture of the semiconductor device 1400 shown in FIGS. 14 to 16. However, the two conductive lines 226 and 232 have different lateral dimensions: the width of the conductive line 226 is smaller than the width of the conductive line 232.

Figure 26:
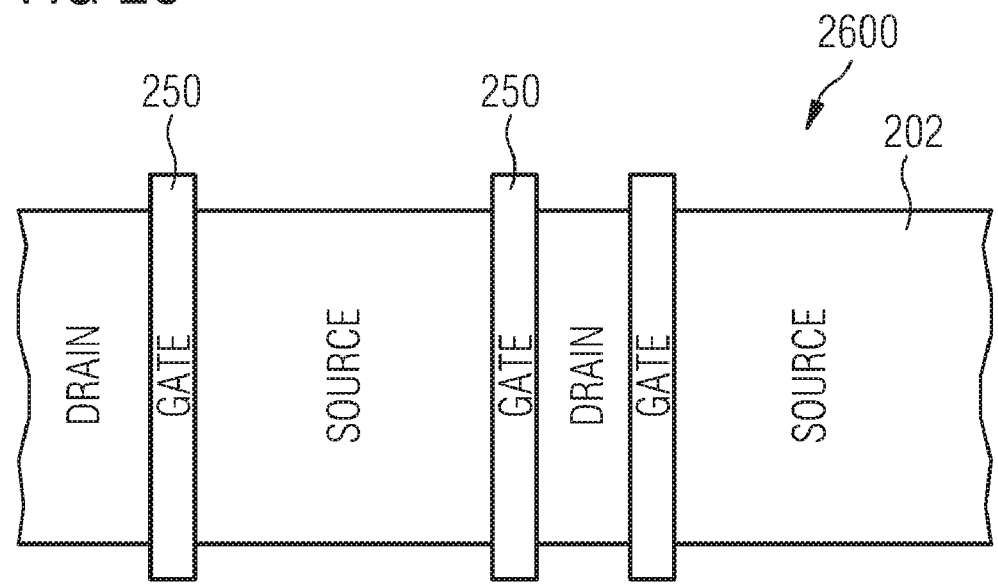
FIG. 26 shows a schematic top view of a semiconductor device according to one embodiment of the present invention.
Figure 27:
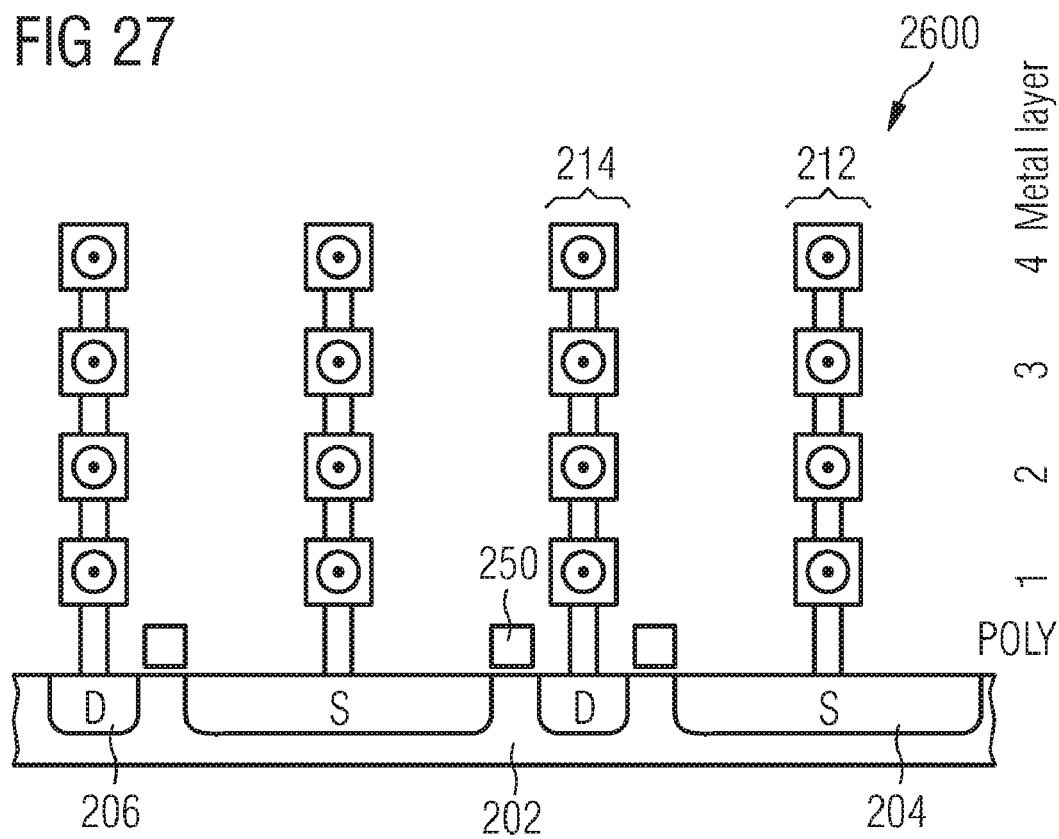
FIG. 27 shows a schematic cross-sectional view of the semiconductor device shown in FIG. 26.

FIGS. 26 and 27 show a semiconductor device 2600 having an architecture being similar to the architecture of the semiconductor device 200 shown in FIGS. 2 to 5. However, the widths of the source regions 204 have been increased. One effect of this embodiment is that the source-drain capacitances as well as the source-gate capacitances are reduced.

Figure 28:
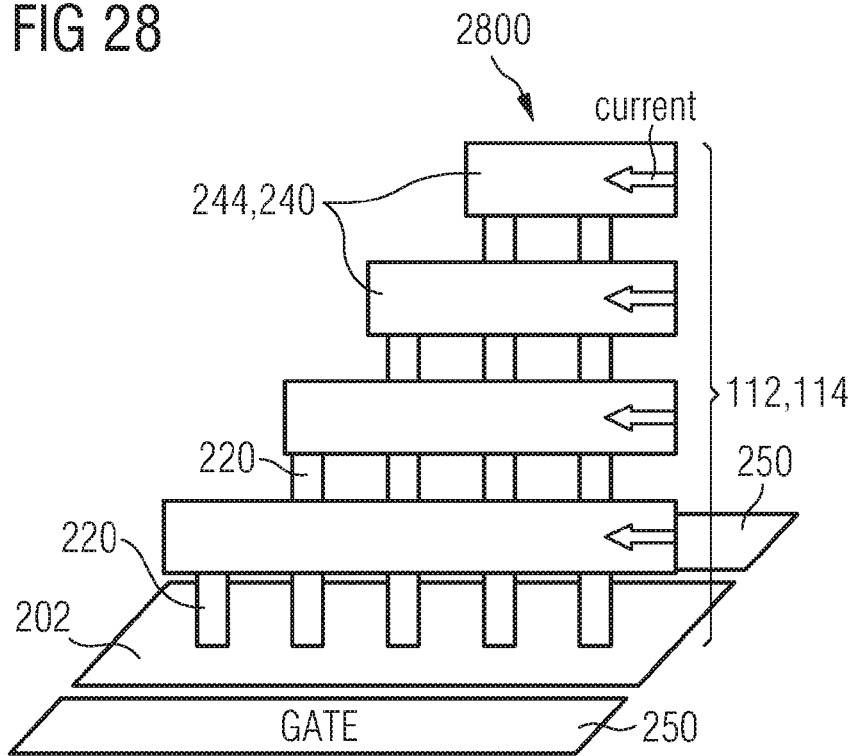
FIG. 28 shows a schematic perspective view (side view) of a semiconductor device according to one embodiment of the present invention.
Figure 29:
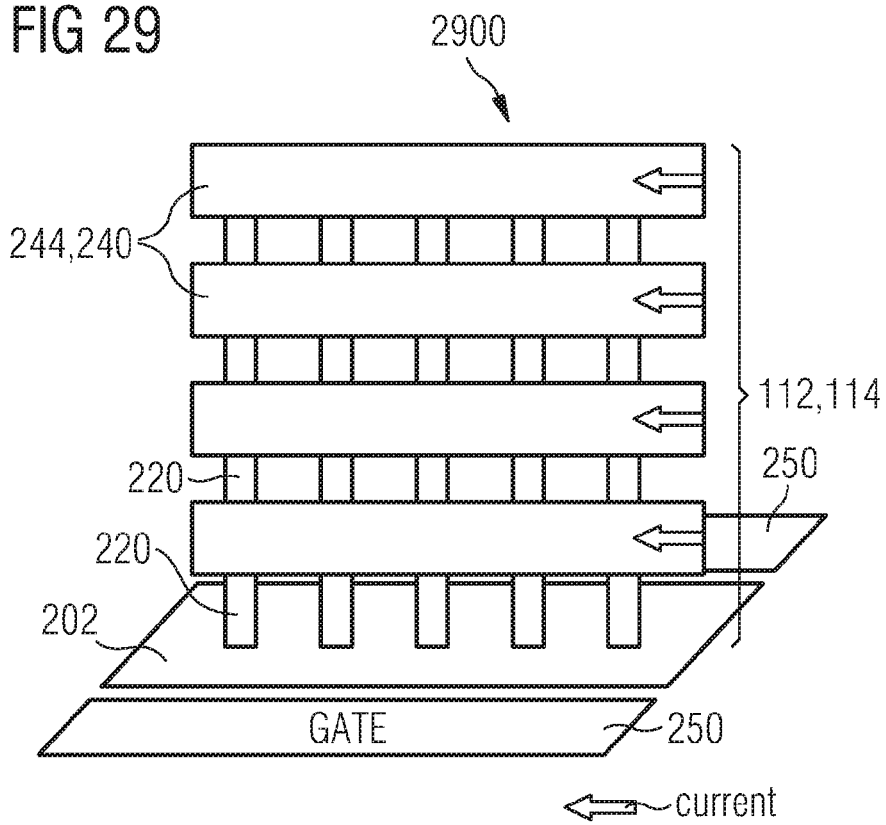
FIG. 29 shows a schematic perspective view (side view) of a semiconductor device according to one embodiment of the present invention.

FIG. 28 shows a semiconductor device 2800 having a stack of conductive lines 240 or 244 (i.e., a drain wiring structure 214 or a source wiring structure 212) having different lengths: the uppermost conductive line has the smallest length, and the lowest conductive line has the largest length. In contrast, FIG. 29 shows a semiconductor device 2900 having a stack of conductive lines 240 or 244 (i.e., a drain wiring structure 214 or a source wiring structure 212) having the same lengths. The embodiments shown in FIGS. 28 and 29 can be applied to all previously discussed embodiments. The embodiments of the present invention are not limited to the length architectures shown in FIGS. 28 and 29.

FIG. 30 shows oscillation frequencies of ring oscillators obtained using a MOS transistor or a semiconductor device according to embodiments of the present invention. FIG. 30 shows frequencies normalized to a conventional MOS transistor layout (layout 200 shown in FIGS. 2 to 5). As can be derived from FIG. 30, the layout 2100 shown in FIG. 21 leads to a very fast switching behavior of the MOS transistor. In particular layout 2100 enables both a reduction of parasitic capacitances and an increase in the maximum currents routed through the MOS transistor.

According to one embodiment of the present invention, a semiconductor device including a plurality of MOS transistors is provided, each MOS transistor including: a semiconductor layer including a source region, a drain region, and a channel region disposed between the source region and the drain region; a gate structure arranged above the channel region; a source wiring structure arranged above the source region and connected to the source region; and a drain wiring structure arranged above the drain region and connected to the drain region. The width of the source region is larger (e.g., three times larger) than the width of the drain region. Alternatively, the width of the source region is smaller (e.g., three times smaller) than the width of the drain region. The source wiring structure may have the same geometrical shape as the drain wiring structure.

One effect of this embodiment is that the lateral distance between the source wiring structure and the drain wiring structure is increased, thereby lowering the capacitance between the source wiring structure and the drain wiring structure even if the geometrical shape of the source wiring structure is identical to the geometrical shape of the drain wiring structure. The same effects holds true concerning the source wiring structure and the gate structure.

According to one embodiment of the present invention, a MOS transistor is provided, including: a semiconductor layer including a source region, a drain region, and a channel region disposed between the source region and the drain region; a gate structure arranged above the channel region; a source wiring structure arranged above the source region and connected to the source region; and a drain wiring structure arranged above the drain region connected to the drain region. The width of the source wiring structure is different from the width of the drain wiring structure (e.g., three times larger or smaller). The source wiring structure may have the same geometrical shape as the drain wiring structure.

Although it has been assumed within all embodiments that the height of the source wiring structure is lower than the height of the drain wiring structure, and the width of the source wiring structure is larger than the width of the drain wiring structure, the invention is not restricted thereto, i.e., source wiring structures and drain wiring structures may be exchanged in respect of their widths and heights.

In the following description, further embodiments of the present invention will be explained.

According to one embodiment of the present invention, a MOS-transistor layout that may be used for analog RF (radio frequency) applications is provided. Asymmetrical drain and source diffusion areas as well as their contacting metal stacks are arranged such that the transistor performance is improved. These modifications allow for increased device currents and reduced parasitic wiring capacitances simultaneously. The embodiments of the present invention may for example be applied to (inverter based) ring oscillators with transistors of identical channel width and length fabricated in a 65 nm digital CMOS technology. An increase of 14% in oscillation frequency compared to classical multi-finger layouts corroborates the improvement by the embodiments of the present invention.

In analog circuits, transistors with multiple gate fingers ("multi finger layout") may be used to keep the gate resistance sufficiently low. In order to avoid electromigration effects, the maximum DC current of each source and drain finger is limited by the cross-sectional area of the connecting metallization. Hence, the DC current of the transistor is limited by the number of fingers and by a minimum reasonable finger length. Drain currents of typical operating points often exceed the permitted values if drain and source diffusion areas are connected via the lowest metallization only.

Thus, the current carrying capacity is enhanced by using several lower metallizations per finger in parallel. However, higher metal layers are often not applicable because their minimum widths are too large. As the cross-sectional area scales with technology, maximum DC currents per finger are further reduced. However, each additional drain and source metallization increases the parasitic capacitances. Hence, in RF applications the performance is degraded by these capacitances and is further limited by the maximum achievable current.

According to one embodiment of the present invention, transistors used in analog circuit design have drain or source terminals which are connected to a dc node. This provides the opportunity to broaden the diffusion area of the dc-terminal and its contacting metals. The increased parasitic capacitance to the substrate has no negative impact on the behavior of the transistor. In this way, higher metallizations at the dc-terminal can be omitted (see FIGS. 8 to 16), and the parasitic source-drain capacitance is significantly reduced.

The current may be still limited by the metallizations of the RF-terminal. It is now possible to increase the transistor current limit by contacting the RF-terminal via higher metal levels with larger minimum widths (see FIGS. 17 to 21). As a consequence, the maximum transistor current can be improved and is now limited by the contacts of the RF-terminal. The presented asymmetrical layouts enhance the RF performance of submicron CMOS transistors due to the reduced parasitic capacitances. At the same time, it is possible to relax electromigration limits. According to one embodiment of the present invention, RF circuits are provided including semiconductor devices/MOS transistors according to embodiments of the present invention, e.g., ring oscillators. According to one embodiment of the present invention, RF circuits are provided where the drain node guides the RF signal (e.g., common source circuits). In this case, the width of the source wiring structure is larger than the width of the drain wiring structure, and the height of the source wiring structure is smaller than the height of the drain wiring structure. Alternatively, RF circuits are provided where the source node guides the RF signal (e.g., source follower circuits). In this case, the width of the drain wiring structure is larger than the width of the source wiring structure, and the height of the drain wiring structure is smaller than the height of the source wiring structure.

Using such RF circuits, parasitic drain source capacitance caused by the source/drain wiring structures can be significantly reduced. For example, parasitic drain source capacitance can be reduced by a factor 5 in CMOS technology. Also, the parasitic source gate capacitance is reduced. The source resistance can be reduced due to the broader low ohmic contacting of the source area (the source resistance is important for the effective gm (transconductance)). If shallow trench isolations (STIs) are used for isolating the semiconductor substrate of the RF circuits, less mechanical stress will result, compared to isolation semiconductor wells of conventional solutions, due to the enlarged distance between the gate structure and the STIs (STIs need less lateral space). As a consequence, a higher mobility of charge carriers can be achieved leading to a higher gm, in particular in NMOS circuits which are relevant for RF circuits.

Possible disadvantages of increased source bulk capacitance (capacitance between the source wiring structure and the substrate including the source area) are less important if there is no too high dynamical potential difference between the bulk (substrate) and the source wiring structure. The gate drain Miller top capacitance can be reduced using a cascode circuit. The high drain resistance on the drain side is not a disadvantage in the context of RF applications since the transistor acts as a current source in saturation and therefore forces the current through this resistance. Further, the broad source contact also reduces coupling signals into the substrate if the source wiring structure is connected to the substrate (broad low ohmic guard ring which eliminates disturbing signals). The only disadvantage is a slight drain source capacitance within the substrate (on the bulk side). This capacitance is mainly defined by the width of the drain junction which is equal to or lower, compared to conventional solutions.

According to one embodiment of the present invention, a MOS transistor is provided, including: a semiconductor layer including a source region, a drain region, and a channel region disposed between the source region and the drain region; a gate structure arranged above the channel region; a source wiring structure arranged above the source region and connected to the source region; and a drain wiring structure arranged above the drain region and connected to the drain region. The width of the source wiring structure is larger than the width of the drain wiring structure, and the height of the source wiring structure is smaller than the height of the drain wiring structure. Alternatively, the width of the source wiring structure is smaller than the width of the drain wiring structure, and the height of the source wiring structure is larger than the height of the drain wiring structure.

According to one embodiment of the present invention, the widths and the heights of the source wiring structure and the drain wiring structure are chosen such that parasitic capacitances between the source wiring structure and the drain wiring structure are reduced or the maximum current routable through the source wiring structure and the drain wiring structure is increased.

According to one embodiment of the present invention, a ratio: width of the source wiring structure/width of the drain wiring structure ranges between 1 and 8, and a ratio: height of the source wiring structure/height of the drain wiring structure ranges between 1 and 8; or a ratio: width of the drain wiring structure/width of the source wiring structure ranges between 1 and 8, and a ratio: height of the drain wiring structure/height of the source wiring structure ranges between 1 and 8.

According to one embodiment of the present invention, the source wiring structure includes a source wiring layer or a plurality of source wiring layers stacked above each other, and the drain wiring structure includes a drain wiring layer or a plurality of drain wiring layers stacked above each other.

According to one embodiment of the present invention, the number of stacked wiring layers of the source wiring structure is lower than the number of stacked wiring layers of the drain wiring structure, and the width of the source wiring structure is larger than the width of the drain wiring structure, or the number of stacked wiring layers of the drain wiring structure is lower than the number of stacked wiring layers of the source wiring structure, and the width of the drain wiring structure is larger than the width of the source wiring structure.

According to one embodiment of the present invention, the wiring layers that are stacked above each other are electrically connected with each other by electrical connections.

According to one embodiment of the present invention, the wiring layers include or consist of conductive lines.

According to one embodiment of the present invention, the thicknesses of conductive lines of upper wiring layers are larger than thicknesses of conductive lines of lower wiring layers.

According to one embodiment of the present invention, a semiconductor device including a plurality of MOS transistors connected in parallel is provided, each MOS transistor including: a semiconductor layer including a source region, a drain region, and a channel region disposed between the source region and the drain region; a gate structure arranged above the channel region; a source wiring structure arranged above the source region and connected to the source region; and a drain wiring structure arranged above the drain region and connected to the drain region. The width of the source wiring structure is larger than the width of the drain wiring structure, and the height of the source wiring structure is smaller than the height of the drain wiring structure, or the width of the source wiring structure is smaller than the width of the drain wiring structure, and the height of the source wiring structure is larger than the height of the drain wiring structure.

According to one embodiment of the present invention, the source regions and the drain regions are formed within a common semiconductor layer such that source regions and drain regions alternate with each other.

According to one embodiment of the present invention, the widths and the heights of the source wiring structure and the drain wiring structure of each MOS transistor are chosen such that parasitic capacitances between the source wiring structure and the drain wiring structure are reduced, or the maximum current routable through the source wiring structure and the drain wiring structure is increased.

According to one embodiment of the present invention, a ratio: width of the source wiring structure/width of the drain wiring structure of each MOS transistor ranges between 1 and 8, and a ratio: height of the source wiring structure/height of the drain wiring structure of each MOS transistor ranges between 1 and 8; or a ratio: width of the drain wiring structure/width of the source wiring structure of each MOS transistor ranges between 1 and 8, and a ratio: height of the drain wiring structure/height of the source wiring structure of each MOS transistor ranges between 1 and 8.

According to one embodiment of the present invention, the source wiring structure of each MOS transistor includes a source wiring layer or a plurality of source wiring layers stacked above each other, and the drain wiring structure of each MOS transistor includes a drain wiring layer or a plurality of drain wiring layers stacked above each other.

According to one embodiment of the present invention, for each MOS transistor, the number of stacked wiring layers of the source wiring structure is lower than the number of stacked wiring layers of the drain wiring structure, and the width of the source wiring structure is larger than the width of the drain wiring structure; or, for each MOS transistor, the number of stacked wiring layers of the drain wiring structure is lower than the number of stacked wiring layers of the source wiring structure, and the width of the drain wiring structure is larger than the width of the source wiring structure.

According to one embodiment of the present invention, the wiring layers of the source wiring structure and the conductive elements of the wiring layers of the drain wiring structure respectively include finger like conductive elements.

According to one embodiment of the present invention, a first source wiring layer includes two conductive lines, and a second source wiring layer includes one conductive line, wherein the lateral distance between the conductive line of the second source wiring layer and the conductive line of the corresponding second drain wiring layer is higher than the lateral distance between one of the conductive lines of the first source wiring layer and the conductive line of the corresponding first drain wiring layer; or a first drain wiring layer includes two conductive lines, and a second drain wiring layer includes one conductive line, wherein the lateral distance between the conductive line of the second drain wiring layer and the conductive lines of the corresponding second source wiring layer is higher than the lateral distance between one of the conductive lines of the first drain wiring layer and the conductive lines of the corresponding first source wiring layer.

According to one embodiment of the present invention, the first source wiring layer is the lowest source wiring layer, and the first drain wiring layer is the lowest drain wiring layer.

According to one embodiment of the present invention, the widths of the source regions are larger than the widths of the drain regions, or the widths of the drain regions are larger than the widths of the source regions.

According to one embodiment of the present invention, the widths and the heights of the source wiring structure and the drain wiring structure are chosen such that parasitic capacitances between the source wiring structure and the gate structure, or between the drain wiring structure and the gate structure are minimized.

According to one embodiment of the present invention, each of the two conductive lines of the first source wiring layer is connected to the source region via an electrical connection, wherein each electrical connection is spaced apart from the closest gate structure as far as possible; or each of the two conductive lines of the first drain wiring layer is connected to the drain region via an electrical connection, wherein each electrical connection is spaced apart from the closest gate structure as far as possible.

According to one embodiment of the present invention, the top source wiring layer is electrically connected to a conductive plate arranged above the top source wiring layer, or the top drain wiring layer is electrically connected to a conductive plate arranged above the top drain wiring layer.

According to one embodiment of the present invention, a MOS transistor is provided, including: a semiconductor layer including a source region, a drain region, and a channel region disposed between the source region and the drain region; a gate structure arranged above the channel region; a source wiring structure arranged above the source region and connected to the source region; and a drain wiring structure arranged above the drain region and connected to the drain region. The source wiring structure together with the drain wiring structure forms a wiring structure having an asymmetrical shape.

Within the scope of the present invention, the term "a first layer is disposed above a second layer" means that the first layer is directly arranged on the second layer, or means that at least one further layer is arranged between the first layer and the second layer. The same applies in an analogous manner for the term "a first layer is disposed below a second layer".

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A MOS transistor, comprising:
   a semiconductor layer comprising a first source/drain region, a second source/drain region, and a channel region disposed between the first source/drain region and the second source/drain region;
   a gate structure disposed over the channel region;
   a first wiring structure disposed over the first source/drain region and electrically connected to the first source/drain region, the first wiring structure having a height and a width, the first wiring structure conducting a current in or a current out of only the first source/drain region; and
   a second wiring structure disposed over the second source/drain region and electrically connected to the second source/drain region, the second wiring structure having a height and a width, the second wiring structure conducting a current in or a current out of only the second source/drain region, wherein the width of a portion of the first wiring structure directly adjacent to and directly physically connected to the first source/drain region is larger than the width of a portion of the second wiring structure directly adjacent to and directly physically connected to the second source/drain region, and wherein the height of the first wiring structure is smaller than the height of the second wiring structure.

2. The transistor according to claim 1, wherein the widths and the heights of the first wiring structure and the second wiring structure are chosen such that parasitic capacitances between the first wiring structure and the second wiring structure are reduced or a maximum current routable through the first wiring structure and the second wiring structure is increased.

3. The transistor according to claim 1, wherein a ratio of the width of the first wiring structure to the width of the second wiring structure is less than about 8, and wherein a ratio of the height of the first wiring structure to the height of the second wiring structure is less than about 8.

4. The transistor according to claim 1, wherein the first wiring structure comprises one or more wiring layers above the first source/drain region, and wherein the second wiring structure comprises a plurality of wiring layers above the second source/drain region.

5. The transistor according to claim 4, wherein the number of wiring layers of the second wiring structure is greater than the number of wiring layers of the first wiring structure.

6. The transistor according to claim 4, wherein the wiring layers above the second source/drain region are electrically connected to each other by electrical connections.

7. The transistor according to claim 6, wherein the wiring layers comprise conductive lines.

8. The transistor according to claim 7, wherein the conductive lines of upper wiring layers have thickness that are larger than thicknesses of the conductive lines of lower wiring layers.

9. A MOS transistor, comprising:
   a semiconductor layer comprising a source region, a drain region, and a channel region disposed between the source region and the drain region;
   a gate structure disposed over the channel region;
   a source wiring structure disposed over the source region and electrically connected to the source region, the source wiring structure conducting a current in or a current out of only the source region; and
   a drain wiring structure disposed over the drain region and electrically connected to the drain region, the drain wiring structure conducting a current in or a current out of only the drain region, wherein the source wiring structure together with the drain wiring structure forms a wiring structure having an asymmetrical shape, wherein the width of a portion of the source wiring structure directly adjacent to and directly physically connected to the source region is larger or smaller than the width of a portion of the drain wiring structure directly adjacent to and directly physically connected to the drain region.

10. A MOS transistor, comprising:
    a semiconductor layer comprising a source region, a drain region, and a channel region disposed between the source region and the drain region;
    a gate structure disposed over the channel region;
    a source wiring structure disposed over the source region and electrically connected to the source region, the source wiring structure having a first width at a portion of the source wiring structure that is directly adjacent to and directly physically connected to the source region, the source wiring structure conducting a current in or a current out of only the source region; and
    a drain wiring structure disposed over the drain region and electrically connected to the drain region, the drain wiring structure having a second width at a portion of the drain wiring structure that is directly adjacent to and directly physically connected to the drain region that is different than the first width, the drain wiring structure conducting a current in or a current out of only the drain region.

* * * * *